United States Patent
Kato et al.

(10) Patent No.: US 6,198,690 B1
(45) Date of Patent: Mar. 6, 2001

(54) CLOCK CONTROL CIRCUIT WITH AN INPUT STOP CIRCUIT

(75) Inventors: Koji Kato; Masahiro Kamoshida; Shigeo Ohshima, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/503,000

(22) Filed: Feb. 14, 2000

(30) Foreign Application Priority Data

Feb. 15, 1999 (JP) ................................................ 11-035946

(51) Int. Cl.[7] ........................................................ G11C 8/00
(52) U.S. Cl. .................... 365/233; 365/194; 327/158; 327/159; 327/161; 327/299; 327/154
(58) Field of Search .................................. 365/233, 194; 326/93; 327/154, 299, 158, 161, 159

(56) References Cited

U.S. PATENT DOCUMENTS

| | | | |
|---|---|---|---|
| 5,566,129 | * 10/1996 | Nakashima et al. | 365/233.5 |
| 5,604,775 | * 2/1997 | Saitoh et al. | 375/376 |
| 5,867,432 | 2/1999 | Toda | 365/194 |
| 5,870,445 | 2/1999 | Farwell | 375/371 |
| 5,923,613 | 7/1999 | Tien et al. | 365/233 |
| 5,986,949 | * 11/1999 | Toda | 365/194 |

* cited by examiner

Primary Examiner—David Nelms
Assistant Examiner—Connie C. Yoha
(74) Attorney, Agent, or Firm—Finnegan, Henderson, Farabow, Garrett, & Dunner L.L.P.

(57) ABSTRACT

A clock control circuit includes a forward pulse delay circuit including a plurality of delay circuits for delaying a forward pulse signal FCL, a backward pulse delay circuit including a plurality of delay circuits for delaying a backward pulse signal RCL, a state-hold section including a plurality of state-hold circuits for controlling the operation of the backward pulse delay circuit in accordance with the transmission condition of the forward pulse signal in the forward pulse delay circuit, and an input stop circuit for stopping inputting a pulse corresponding to an external clock signal to the backward pulse delay circuit during a predetermined period from the time point when the external clock signal begins to be supplied.

28 Claims, 16 Drawing Sheets

US 6,198,690 B1

CLOCK CONTROL CIRCUIT WITH AN INPUT STOP CIRCUIT

CROSS-REFERENCE TO RELATED APPLICATION

This application is based upon and claims the benefit of priority from the prior Japanese Patent Application No. 11-035946, filed Feb. 15, 1999, the entire contents of which are incorporated herein by reference.

BACKGROUND OF THE INVENTION

The present invention relates to a clock control circuit most suitable for a circuit subjected to synchronization control using a high-speed clock signal.

In recent years, a clock sync-type memory such as a synchronous DRAM has sometimes been used to meet the demand for a high processing speed of a computer system. Such a clock sync-type memory device uses an internal clock signal in synchronism with a clock signal input thereto for controlling the memory.

In the case where a delay occurs between the internal clock signal used in the memory device and an external clock signal input from an external source for controlling the memory device, the internal circuits of the memory device high in operating speed are liable to develop a malfunction even if the delay is small.

In view of this, a semiconductor integrated circuit such as a memory device using a clock signal includes a clock control circuit built in a memory integrated circuit for assuring synchronism between the internal clock signal and the external clock signal. First, the operating principle of this clock control circuit will be explained.

FIG. 1 shows a clock control circuit of synchronous adjustable delay (SAD) type including a synchronous traced backward delay (STBD) disclosed in U.S. Pat. No. 5,867,432 granted to Haruki Toda. This clock control circuit of SAD type is well known for its high sync speed and small power consumption. The contents of which are incorporated herein by reference in their entirely.

The circuit of FIG. 1 includes a clock receiver 11, a delay monitor circuit 12, a forward pulse delay circuit 14 having a plurality of delay circuits 13 connected in a multiplicity of stages in cascade, a backward pulse delay circuit 16 having delay circuits 15 connected in a multiplicity of stages in cascade in the same number as stages of the delay circuits 13 in the forward pulse delay circuit 14, and a state-hold section 18 having a plurality of state-hold circuits 17 as many as the delay circuits arranged in the forward pulse delay circuit 14 and the backward pulse delay circuit 16 for outputting a control signal for controlling the pulse delay operation in the backward pulse delay circuit 16 in accordance with the pulse delay state of the forward pulse delay circuit 14, a control signal generating circuit 19 for outputting control signals P, /P for controlling the operation of the forward pulse delay circuit 14 and the state-hold section 18, and a driver 20.

The output from the delay circuit 13 in the Nth stage in the forward pulse delay circuit 14 is input to the Nth-stage state-hold circuit 17 in the state-hold section 18, and the output from the Nth-stage state-hold circuit 17 in the state-hold section 18 is input to the (N−1)th-stage delay circuit 15 in the backward pulse delay circuit 16.

FIG. 2 is a timing chart for explaining the operating principle of the clock control circuit shown in FIG. 1. With reference to FIGS. 1 and 2, the operating principle of the conventional clock control circuit will be explained.

Now, assume that an external clock signal ExtCLK having a cycle of τ is input to the clock receiver 11. The external clock signal ExtCLK is shaped in waveform and amplified by the receiver 11 and output as a pulse signal CLK. In the case where a delay time in the clock receiver 11 is Trc, the pulse signal CLK is delayed by Trc behind the external clock signal ExtCLK, as shown in FIG. 2. The pulse signal CLK output from the receiver 11 is input to the delay monitor circuit 12, the control signal generating circuit 19 and the backward pulse delay circuit 16.

The control signal generating circuit 19 receives the pulse signal CLK, and as shown in FIG. 2, outputs a control signal P having a pulse width Wp in synchronism with the leading edge of the pulse signal CLK. Though not shown, the control signal generating circuit 19 outputs, together with the control signal P, a control signal /P having a level complementary with the control signal P. Where a delay time in the driver 20 is Tdr, the pulse width Wp of the control signal P is set shorter than the period (Trc+Tdr). The reason is that if the width Wp of the control signal P is longer than (Trc+Tdr), the output from the delay monitor circuit 12 fails to correctly propagate through the forward pulse delay circuit 14.

The delay monitor circuit 12 has a delay time (Trc+Tdr) equal to the sum of the delay time Trc in the receiver 11 and the delay time Tdr in the driver 20. Thus, the pulse signal FCL output from the delay monitor circuit 12, as shown in FIG. 2, is delayed by (Trc+Tdr) behind the pulse signal CLK output from the receiver 11 and input to the forward pulse delay circuit 14.

The forward pulse delay circuit 14 is configured with a plurality of delay circuits 13 connected in a multiplicity of stages in cascade. The delay circuit 13 in each stage transmits a forward pulse signal to the succeeding stage from the preceding stage when the control signal P is "L", while the transmission of the forward pulse signal is stopped when the control signal P is "H".

During the period {τ−(Trc+Tdr)} from the time point when the transmission is started of the pulse signal FCL through the forward pulse delay circuit 14 to the time when the control signal P rises to "H" level, the pulse signal FCL is transmitted through the forward pulse delay circuit 14.

The state-hold section 18 stores the transmission state of the forward pulse signal through the forward pulse delay circuit 14 in each state-hold circuit 17, and controls the operation of the backward pulse delay circuit 16 based on the information stored in the state-hold circuit 17 in such a manner that the transmission time of the backward pulse signal is equal to the transmission time of the forward pulse. Specifically, all the state-hold circuits 17 in the state-hold section 18 are initially reset. Those state-hold circuits 17 corresponding to the delay circuits 13 in the forward pulse delay circuit 14 to which the forward pulse signal is not transmitted remain reset as in their initial state.

The state-hold circuits 17 corresponding to the delay circuits 13 in the forward pulse delay circuit 14 to which the forward pulse signal is transmitted, on the other hand, are turned to set state. The control signal generated in accordance with the set/reset state of each state-hold circuit 17 is input to the backward pulse delay circuit 16.

The delay circuits 15 in the backward pulse delay circuit 16 controlled by the control signal from the state-hold circuit 17 corresponding to the set state output the backward pulse signal transmitted from the delay circuit 15 in the succeeding stage to the delay circuit 15 in the preceding stage.

The delay circuit 15 in the backward pulse delay circuit 16 controlled by the control signal from the state-hold circuit 17 corresponding to the reset state, on the other hand, outputs the pulse signal CLK output from the receiver 11 to the delay circuit 15 in the preceding stage.

When the control signal P changes to "H" level, the pulse signal CLK also changes to "H", and therefore the delay circuits 15 ((N+1)th and subsequent stages in FIG. 1) in the backward pulse delay circuit 16 controlled by the control signal from the state-hold circuit 17 in reset state are supplied with the "H" pulse signals CLK in parallel.

As shown in FIG. 1, assuming that there are N stages of the delay circuits 13 in the forward pulse delay circuit 14 through which the forward pulse signal is transmitted, the state-hold circuits 17 in the first to Nth stages of the state-hold section 18 are in set (S) state. As a result, the delay circuit 15 in the Nth stage in the backward pulse delay circuit 16 is controlled by the control signal from the state-hold circuit 17 in the (N+1)th stage of the state-hold section 18 in reset (R) state, and therefore the input pulse signal CLK is transmitted as a backward pulse signal to the delay circuit 15 in the preceding stage.

Consequently, the number of the delay circuits 15 through which the backward pulse signal is transmitted equals the number of stages of the delay circuits 13 in the forward pulse delay circuit 14 through which the forward pulse signal is transmitted.

Assume that each delay circuit in the forward pulse delay circuit 14 and the backward pulse delay circuit 16 is designed to have the same signal delay time. The pulse signal CLK input to the backward pulse delay circuit 16 is transmitted through the delay circuit 15 during the same period of $\{\tau-(Trc+Tdr)\}$ as in the case where the forward pulse signal is transmitted through the forward pulse delay circuit 14, and is output as a pulse signal RCL as shown in FIG. 2.

This pulse signal RCL is subsequently passed through the driver 20 and thus output as an internal clock signal IntCLK delayed by the period of Tdr.

Now, let $\Delta$total be the delay time from the time when the external clock signal ExtCLK is input to the time point when the internal clock signal IntCLK is output. Then, the time $\Delta$total is given as $$\Delta total = \Delta msr + \Delta prp \quad (1)$$

In equation (1), $\Delta$msr is the time during which the forward pulse signal is passed through several delay circuits 13 in the forward pulse delay circuit 14, and $\Delta$prp is the time required for the backward pulse to transmit through the delay circuits 15 in the backward pulse delay circuit 16 in the number corresponding to the number of the stages through which the forward pulse signal is transmitted and thereby to output the internal clock signal IntCLK.

As described above, the time Trc is required for the passage of the external clock signal ExtCLK through the receiver 11, the time (Trc+Tdr) is required for the passage of the pulse signal CLK through the delay monitor circuit 12, the time $\{\tau-(Trc+Tdr)\}$ is required for the passage of the pulse signal FCL through the forward pulse delay circuit 14, the time $\{\tau-(Trc+Tdr)\}$ is required for the passage of the pulse signal CLK through the backward pulse delay circuit 16, and the time Tdr is required for the passage of the pulse signal RCL through the driver 20. Thus, $\Delta$msr, $\Delta$prp in equation (1) are given as $$\Delta msr = (Trc+Tdr) + \{\tau-(Trc+Tdr)\} = \tau \quad (2)$$

$$\Delta prp = Trc + \{\tau-(Trc+Tdr)\}\tau + Tdr = \tau \quad (3)$$

Specifically, $\Delta$total is $2\tau$, and therefore the internal clock signal IntCLK is synchronized in two cycles of the external clock signal ExtCLK, and remains in synchronism with the external clock signal ExtCLK from the third clock.

The external clock signal is known to contain a jitter. The jitter is defined as a variation of the period of the clock signal. The clock control circuit is required to operate normally even in the presence of a jitter in the external clock signal ExtCLK.

As shown in FIG. 3, for example, even in the case where the period of the external clock signal ExtCLK is shortened by $\delta$ as compared with the period $\tau$ one cycle before due to the jitter, the establishment of a synchronism requires that the backward pulse RCL is output by delaying the pulse signal CLK in the delay circuits 15 of the backward pulse delay circuit 16 in the number of stages corresponding to the delay circuits 13 in the forward pulse delay circuit 14 through which the transmission of the forward pulse signal is stopped. Specifically, the output pulse signal CLK from the receiver 11 corresponding to the external clock signal ExtCLK of the period $(\tau-\delta)$ is required to be delayed by the period $(\tau-\delta)-(Trc+Tdr)$ by the backward pulse delay circuit 16.

In one preceding cycle, however, the forward pulse signal is delayed by the period of $\tau-(Trc+Tdr)$ by the forward pulse delay circuit 14. Accordingly, the state-hold circuit 17 (two state-hold circuits 17 in FIG. 3) in the state-hold section 18 in the portion defined by dashed line in FIG. 3 is in set (S) state.

Thus, for the pulse signal CLK to be delayed by the period of $(\tau-\delta)-(Trc+Tdr)$ by the backward pulse delay circuit 16 subsequently, the state-hold circuit 17 in the state-hold section 18 in the portion defined by dashed line in FIG. 3 is required to be restored from the set (S) state to the reset (S) state before starting the transmission of the forward pulse signal for the next cycle.

The trouble is that the clock control circuit shown in FIG. 1 cannot meet the required conditions when the duty cycle of the external clock signal reaches 50% or more.

Also, the specification of U.S. patent application Ser. No. 09/271,329 filed by Kamoshida et al. discloses a clock control circuit which eliminates the effect of the jitter contained in the external clock signal and which is capable of operation even in the case where the duty cycle of the external clock signal is not less than 50%. FIG. 4 is a block diagram showing a configuration of the clock control circuit disclosed in the specification of the particular patent application. The contents of which are incorporated herein by reference in their entirely.

Now, the configuration, function and the problem points of the circuit shown in FIG. 4 will be explained.

The clock control circuit shown in FIG. 4 is different from the circuit of FIG. 1 in that the clock control circuit of FIG. 4 further comprises a state-hold section reset circuit 21 and a control circuit 22 newly added thereto, that the pulse width of the pulse signal passed through the delay monitor circuit 12 can be adjusted in accordance with the control signal CTL output from the control circuit 22, and that the operation of the state-hold section 18 is controlled based on the control signals PM, /PM output from the control circuit 22 newly added.

The control circuit 22 outputs the control signals PM, /PM for controlling the operation of the state-hold section 18 in accordance with the backward pulse signal RCL and the control signals P, /P, and also outputs a control signal CTL for adjusting the pulse width of the pulse signal passed through the delay monitor circuit 12.

The control signal CTL is input to the delay monitor circuit 12. Based on this control signal CTL, the pulse width of the pulse signal output from the delay monitor circuit 12 is adjusted.

Now, the operation of the control circuit 22 will be explained with reference to the flowchart of FIG. 5.

In step S1, it is determined whether the backward pulse signal RCL is "H" or not when the control signal /P rises. In the case where the backward pulse signal RCL is "H", the process proceeds to step S2. In step S2, the control signal /PM is generated after the backward pulse signal RCL turns "L". In the case where the backward pulse signal RCL is "L", on the other hand, the process proceeds to step S3. In step S3, the control signal /PM in synchronism with the control signal /P is generated.

As long as the control signal /PM is "H", each state-hold circuit 17 in the state-hold section 18 is set to each output state based on the backward pulse signal transmitted through the forward pulse delay circuit 14.

Specifically, in steps S1 to S3, the level of the control signal /PM is set for controlling the operation of the state-hold section 18.

During the period when the control signal /PM is "H", the output signal of the state-hold circuit 17 corresponding to the delay circuit 13 in the forward pulse delay circuit 14 through which the forward pulse signal is transmitted is set to "H" level into a set state.

During the period when the control signal /PM is "L", on the other hand, the output signal of the state-hold circuit 17 corresponding to the delay circuit 15 in the backward pulse delay circuit 16 through which the backward pulse signal is transmitted is set to "L" level into a reset state.

The control flow of steps S4 to S6 in FIG. 5 is for obviating the new problem which otherwise might occur due to the control operation using the control signal /PM generated based on the preceding control flow of steps S1 to S3.

Thus, in the case where the control signal /PM generated in the control circuit 22 is in synchronism with the control signal /P, the delay monitor circuit 12 outputs the forward pulse signal FCL directly to the forward pulse delay circuit 14 as it is without extending the pulse width of the forward pulse signal FCL.

Even in the case where the control signal /PM is not in synchronism with the control signal /P, the pulse width of the pulse signal FCL output from the delay monitor circuit 12 is sometimes not required to be extended. In such a case, it is determined in step S4 whether the pulse signal RCL is "H" or not when the pulse signal FCL rises. In the case where the pulse signal RCL is "L", the pulse width of the pulse signal FCL is not required to be extended. After that, in step S6, the control signal CTL is generated to output the forward pulse signal FCL directly to the forward pulse delay circuit 14 as it is without extending the pulse width thereof.

In the case where the pulse signal RCL is "H" when the pulse signal FCL rises, on the other hand, the pulse width of the pulse signal FCL is required to be extended. After that, in step S5, the control signal CTL is generated in such a manner as to extend the pulse width of the forward pulse signal FCL.

In the case where the pulse width of the backward pulse signal is large, the circuit of FIG. 4 poses the following problem. Specifically, when the state-hold section 18 is reset by the state-hold section reset circuit 21, all the state-hold circuits 17 in the state-hold section 18 are set in reset state. As a result, once the input of the external clock signal ExtCLK is started, each delay circuit 15 in the backward pulse delay circuit 16 fetches the pulse signal CLK from the receiver 12 and transmits it to the delay circuit 15 in the preceding stage. As a result, as shown in FIG. 4, the output pulse signal CLK from the receiver 12 which has been input to the delay circuit 15 in the first stage in the backward pulse delay circuit 16 is first delayed by the first-stage delay circuit 15 and output as a pulse signal RCL.

The clock signal having a period τ is required to be delayed by the period {τ−(Trc+Tdr)} by the backward pulse delay circuit 16. However the first backward pulse signal is transmitted only to the delay circuit 15 in the first stage. As shown in the timing chart of FIG. 7, therefore, the pulse signal RCL first output rises at a timing earlier than when it is normally output, and assumes a long pulse signal (RCL1 in FIG. 7) by being superposed on the pulse signal transmitted from the succeeding stage.

The backward pulse signal transmitted by the delay circuits in the succeeding stage of the backward pulse delay circuit 16 will be explained further with reference to FIG. 6.

As described earlier, concurrently with the output of the pulse signal RCL from the first-stage delay circuit 15, the transmission of the forward pulse signal is started by the forward pulse delay circuit 14. As a result, each state-hold circuit 17 in the state-hold section 18 corresponding to the delay circuit in the forward pulse delay circuit 14 through which the forward pulse signal is transmitted turns from reset to set state. Further, each delay circuit in the backward pulse delay circuit 16 corresponding to the state-hold circuit 17 in set state operates to transmit the backward pulse from the succeeding stage to the preceding stage.

As a result, as described earlier, the backward pulse signal sequentially transmitted from the succeeding stage is overlapped with the pulse signal output from the first stage, so that the pulse signal RCL1 first output comes to become a long pulse signal.

When this pulse signal RCL1 is input to the control circuit 22, as shown in the control flow of FIG. 5, the control circuit 22 generates a control signal CTL in such a manner as to extend the pulse signal FCL.

Thus, as shown in the timing chart of FIG. 7, the pulse width of the first pulse signal FCL (FCL1 in FIG. 7) is extended, and overlapped with the next pulse signal FCL. As a result, the internal clock signal IntCLK (the internal clock signal corresponding to the fourth clock of the external clock signal, i.e. IntCLK 3 in FIG. 7) established as the result of the pulse signal FCL of the second cycle being transmitted to the forward pulse delay circuit 14 ceases to be in synchronism with the external clock signal ExtCLK.

The failure of the internal clock signal corresponding to the fourth clock of the external clock signal as described above to be in synchronism with the external clock signal leads to the following inconveniences.

Specifically, the synchronous DRAM of double data rate (DDR) type in which the read data is output in synchronism with both the leading and trailing edges of the external clock signal has generally built therein the clock control circuit as described above. Also, in order to save the power consumption, it has the function of stopping the operation of the clock control circuit. This is commonly called the power down mode, and to leave this state is called "power down exit".

As an example of the power down mode, a timing chart for the active power down mode is shown in FIG. 8A, and a timing chart for the standby power down mode is shown in FIG. 8B. In FIGS. 8A, 8B, characters CKE designate an enable control signal for controlling the power down mode, and characters DQ the read data.

The active power down mode shown in FIG. 8A is the power down mode in the state in which any of the banks is selected (active state), and the standby power down mode shown in FIG. 8B is the power down mode in the state in which none of the banks is selected (non-active state). The "bank" is defined as a memory cell arrays independently operable and a control circuit therefor.

Specifically, when the enable control signal CKE turns "L", the power down mode is entered, while when the enable control signal CKE turns "H", the power down mode is left (power down exit).

In the active power down mode, the output of the data (DQ) is started from the fourth clock of the clock signal after starting to supply the external clock signal ExtCLK. Thus, the internal clock signal IntCLK output from the clock control circuit as a signal corresponding to the fourth clock is required to have the highest sync accuracy.

In the clock control circuit of FIG. 4 or 6, however, as described above, the internal clock signal out of synchronism with the external clock signal is output as the fourth clock of the external clock signal, and therefore the requirement of the data read operation of the highest sync accuracy cannot be met.

In order to assure a sync accuracy, therefore, it is necessary that the clock signal continues to be supplied at least to the clock control circuit even after the supply of the external clock signal is stopped according to the power down mode.

When the supply of the clock signal is stopped, it is desired to stop the operation of the clock control circuit by stopping the supply of the clock signal to the clock control circuit to thus reduce the power consumption to a remarkable degree. Nevertheless, due to the problem described above, the synchronous DRAM would develop a malfunction if the operation of the clock control circuit is stopped. Thus, in order to prevent such a malfunction, the operation of the clock control circuit cannot be stopped even when the supply of the clock signal is stopped.

Also, assume the standby power down mode in which data begins to be read during the standby period ready to receive a command while no bank is active. If the operation of the clock control circuit is stopped during the standby period, the fourth clock of the internal clock signal IntCLK incapable of being synchronized is used for the data read operation requiring the highest sync accuracy. For preventing the malfunction during the standby period, therefore, the operation of the clock control circuit cannot be stopped, thereby leading to the disadvantage that the power consumption cannot be reduced remarkably.

As described above, in the clock control circuit of FIG. 4 or 6, the internal clock signal fails to be synchronized with the external clock signal at the fourth clock after starting to supply the external clock signal. In spite of this, the internal clock signal (fourth clock) incapable of being synchronized is used for the operation requiring the highest sync accuracy. For this reason, in order to assure synchronism, at least the clock control circuit is required to be supplied with the clock signal to keep the clock control circuit in operation. Thus, although it is desired to stop the supply of the clock signal to the clock control circuit and thus to save the power consumption by deenergization of the clock control circuit, the problem pointed out above makes it impossible to stop the supply of the clock signal and thus to stop the operation of the clock control circuit.

BRIEF SUMMARY OF THE INVENTION

Accordingly, it is an object of the present invention to provide a clock control circuit in which an internal clock signal in synchronism with an external clock signal can be output from the third clock, and in any cycle after starting the output of the internal clock signal, the internal clock signal can be synchronized highly accurately with the external clock signal.

According to a first aspect of the invention, there is provided a clock control circuit comprising:

a clock receiver for receiving an external clock pulse;

a first delay circuit for receiving the output of the clock receiver and outputting by delaying the output of the clock receiver by a predetermined arbitrary period;

a forward pulse delay circuit including a plurality of second delay circuits connected in a multiplicity of stages for delaying the output of the first delay circuit by a predetermined arbitrary period through the plurality of the second delay circuits and sequentially transmitting the outputs of the second delay circuit as a forward pulse to the second delay circuit in the succeeding stage;

a backward pulse delay circuit including a plurality of third delay circuits connected in a multiplicity of stages for delaying a backward pulse by a predetermined arbitrary period through the plurality of the third delay circuits, transmitting the backward pulse to the third delay circuit in the preceding stage sequentially and outputting the backward pulse from the third delay circuit in the foremost stage;

a driver for outputting an internal clock pulse in response to the output from the backward pulse delay circuit;

a state-hold section including a plurality of state-hold circuits in the number corresponding to the second delay circuits and the third delay circuits, wherein the output of the second delay circuit is turned from the state not supplied to the forward pulse delay circuit to the state in which the output is input to the forward pulse delay circuit so that the state-hold circuit corresponding to the second delay circuit to which the forward pulse is transmitted is set and so that the state-hold circuit corresponding to the third delay circuit to which the backward pulse is transmitted is reset, and the output of the clock receiver is input as the backward pulses to the third delay circuit corresponding to the state-hold circuit which is reset after the output of the second delay circuit is input to the forward pulse delay circuit and before the backward pulse is transmitted to the backward pulse delay circuit;

an input stop circuit for stopping inputting the output from the clock receiver into the backward pulse delay circuit during a predetermined period from the time when the external clock pulse begins to be supplied;

a state-hold section reset circuit for resetting all the state-hold circuits in the state-hold section before starting to supply the external clock pulse; and a control circuit for monitoring the backward pulse output from the backward pulse delay circuit and, according to the monitor result, resetting several state-hold circuits set after the forward pulse is transmitted to the forward pulse delay circuit.

According to another aspect of the invention, there is provided a clock control circuit comprising:

a clock receiver for receiving an external clock pulse;

a first delay circuit for receiving the output of the clock receiver and outputting by delaying the output of the clock receiver by a predetermined arbitrary period;

a second delay circuit for receiving the output of the first delay circuit and a first control signal for adding a delay of a predetermined arbitrary time to the output of the first delay circuit and outputting the resulting signal;

a forward pulse delay circuit including a plurality of third delay circuits connected in a multiplicity of stages for delaying the output of the second delay circuit by a predetermined arbitrary period through the plurality of the third delay circuits and sequentially transmitting the output of the second delay circuit as a forward pulse to the third delay circuit in the succeeding stage;

a backward pulse delay circuit including a plurality of fourth delay circuits connected in a multiplicity of stages for delaying a backward pulse by a predetermined arbitrary period through the plurality of the fourth delay circuits, transmitting the backward pulses to the fourth delay circuit in the preceding stage sequentially and outputting the backward pulses from the fourth delay circuit in the foremost stage;

a driver for outputting an internal clock pulse in response to the output from the backward pulse delay circuit;

a state-hold section including a plurality of state-hold circuits in the number corresponding to the third delay circuits and the fourth delay circuits, wherein the output of the third delay circuit is turned from the state not supplied to the forward pulse delay circuit to the state in which the output is input to the forward pulse delay circuit so that the state-hold circuit corresponding to the third delay circuit to which the forward pulse is transmitted is set and so that the state-hold circuit corresponding to the fourth delay circuit to which the backward pulse is transmitted is reset, and the output of the clock receiver is input as the backward pulses to the fourth delay circuit corresponding to the state-hold circuit which is reset after the output of the third delay circuit is input to the forward pulse delay circuit and before the backward pulse is transmitted to the backward pulse delay circuit;

an input stop circuit for stopping inputting the output from the clock receiver into the backward pulse delay circuit during a predetermined period from the time when the external clock pulse begins to be supplied;

a state-hold section reset circuit for resetting all the state-hold circuits in the state-hold section before starting to supply the external clock pulse; and a control circuit for monitoring the backward pulse output from the backward pulse delay circuit and, according to the monitor result, resetting several state-hold circuits set after the forward pulse is transmitted to the forward pulse delay circuit.

According to still another aspect of the invention, there is provided a semiconductor memory device comprising:

a memory cell array for storing data and reading the stored data from;

a clock receiver for receiving an external clock pulse;

a clock control circuit; and a data output circuit for receiving the data read from the memory cell array and the pulse output from a backward pulse delay circuit and outputting the data in synchronism with a pulse output from the backward pulse delay circuit;

wherein the clock control circuit includes:

a first delay circuit for receiving the output of the clock receiver and outputting by delaying the output of the clock receiver by a predetermined arbitrary period;

a forward pulse delay circuit including a plurality of second delay circuits connected in a multiplicity of stages for delaying the output of the first delay circuit by a predetermined arbitrary period through the plurality of the second delay circuits and sequentially transmitting the outputs of the second delay circuit as a forward pulse to the second delay circuit in the succeeding stage;

the backward pulse delay circuit including a plurality of third delay circuits connected in a multiplicity of stages for delaying a backward pulse by a predetermined arbitrary period through the plurality of the third delay circuits, transmitting the backward pulse to the third delay circuit in the preceding stage sequentially and outputting the backward pulse from the third delay circuit in the foremost stage;

a state-hold section including a plurality of state-hold circuits in the number corresponding to the second delay circuits and the third delay circuits, wherein the output of the second delay circuit is turned from the state not supplied to the forward pulse delay circuit to the state in which the output is input to the forward pulse delay circuit so that the state-hold circuit corresponding to the second delay circuit to which the forward pulse is transmitted is set and so that the state-hold circuit corresponding to the third delay circuit to which the backward pulse is transmitted is reset, and the output of the clock receiver is input as the backward pulses to the third delay circuit corresponding to the state-hold circuit which is reset after the output of the second delay circuit is input to the forward pulse delay circuit and before the backward pulse is transmitted to the backward pulse delay circuit;

an input stop circuit for stopping inputting the output from the clock receiver into the backward pulse delay circuit during a predetermined period from the time when the external clock pulse begins to be supplied;

a state-hold section reset circuit for resetting all the state-hold circuits in the state-hold section before starting to supply the external clock pulse; and a control circuit for monitoring the backward pulse output from the backward pulse delay circuit and, according to the monitor result, resetting several state-hold circuits set after the forward pulse is transmitted to the forward pulse delay circuit.

According to yet another aspect of the invention, there is provided a clock control circuit comprising:

a first clock output circuit for receiving a first external clock pulse and outputting a first internal clock pulse; and a second clock output circuit for receiving a second external clock pulse and outputting a second internal clock pulse;

wherein each of the first clock output circuit and the second clock output circuit includes;

a clock receiver for receiving one of the first and the second external clock pulses;

a first delay circuit for receiving the output of the clock receiver and outputting by delaying the output of the clock receiver by a predetermined arbitrary period;

a forward pulse delay circuit including a plurality of second delay circuits connected in a multiplicity of stages for delaying the output of the first delay circuit by a predetermined arbitrary period through the plurality of the second delay circuits and sequentially transmitting the outputs of the second delay circuit as a forward pulse to the second delay circuit in the succeeding stage;

a backward pulse delay circuit including a plurality of third delay circuits connected in a multiplicity of stages for delaying a backward pulse by a predetermined arbitrary period through the plurality of the third delay circuits, transmitting the backward pulse to the third delay circuit in the preceding stage sequentially and outputting the backward pulse from the second delay circuit in the foremost stage;

a driver for outputting one of the first and the second internal clock pulses in response to the output from the backward pulse delay circuit;

a state-hold section including a plurality of state-hold circuits in the number corresponding to the second delay circuits and the third delay circuits, wherein the output of the second delay circuit is turned from the state not supplied to the forward pulse delay circuit to the state in which the output is input to the forward pulse delay circuit so that the state-hold circuit corresponding to the second delay circuit to which the forward pulse is transmitted is set and so that the state-hold circuit corresponding to the third delay circuit to which the backward pulse is transmitted is reset, and the output of the clock receiver is input as the backward pulses to the third delay circuit corresponding to the state-hold circuit which is reset after the output of the second delay circuit is input to the forward pulse delay circuit and before the backward pulse is transmitted to the backward pulse delay circuit;

an input stop circuit for stopping inputting the output from the clock receiver to the backward pulse delay circuit during a predetermined period from the time when one of the first and second external clock pulses begins to be supplied;

a state-hold section reset circuit for resetting all the state-hold circuits in the state-hold section before starting to supply one of the first and second external clock pulses; and a control circuit for monitoring the backward pulse output from the backward pulse delay circuit and, according to the monitor result, resetting several state-hold circuits set after the forward pulse is transmitted to the forward pulse delay circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the drawings.

Figure 9:
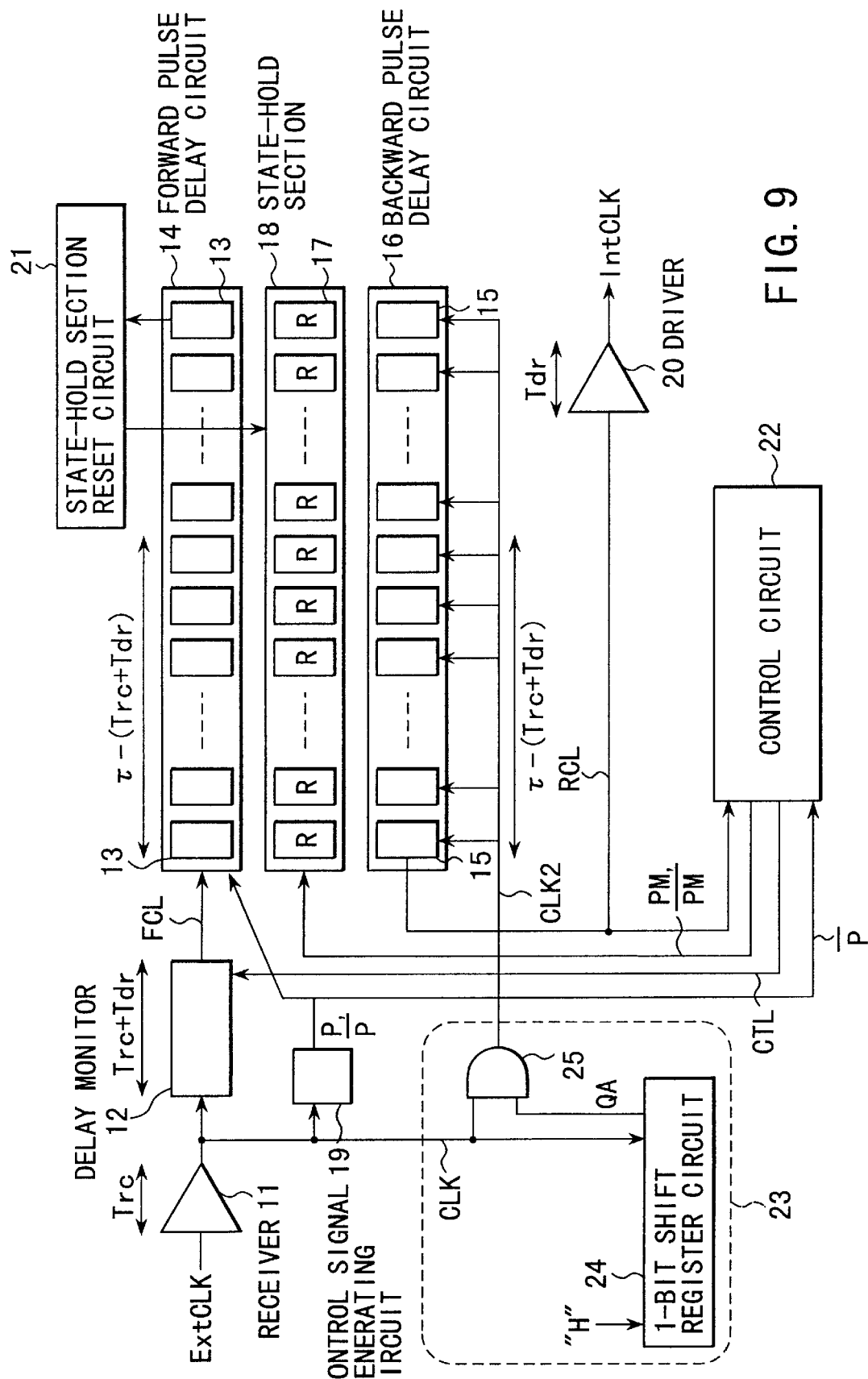
FIG. 9 is a block diagram showing a configuration of a clock control circuit according to a first embodiment of the invention.

FIG. 9 is a block diagram showing a configuration of the clock control circuit according to a first embodiment of the invention. This circuit, like the circuit shown in FIG. 4 or 6, comprises a clock receiver 11, a delay monitor circuit 12, a forward pulse delay circuit 14 including a plurality of delay circuits 13 connected in a multiplicity of stages in cascade, a backward pulse delay circuit 16 including a plurality of delay circuits 15 connected in a multiplicity of stages in cascade in the same number as the delay circuits in the forward pulse delay circuit 14, a state-hold section 18 having a plurality of state-hold circuits 17 in the same number as the delay circuits 13, 15 in the forward pulse delay circuit 14 and the backward pulse delay circuit 16 for outputting a control signal for controlling the pulse delay operation in the backward pulse delay circuit 16 in accordance with the pulse delay state in the forward pulse delay circuit 14, a control signal generating circuit 19 for outputting complementary control signals P, /P in response to the output pulse CLK from the clock receiver 11, a driver 20 supplied with the output pulse RCL from the backward pulse delay circuit 16 for outputting an internal clock signal IntCLK, a state-hold section reset circuit 21 for resetting the state-hold circuit 17 in the state-hold section 18, and a control circuit 22.

Figure 1:
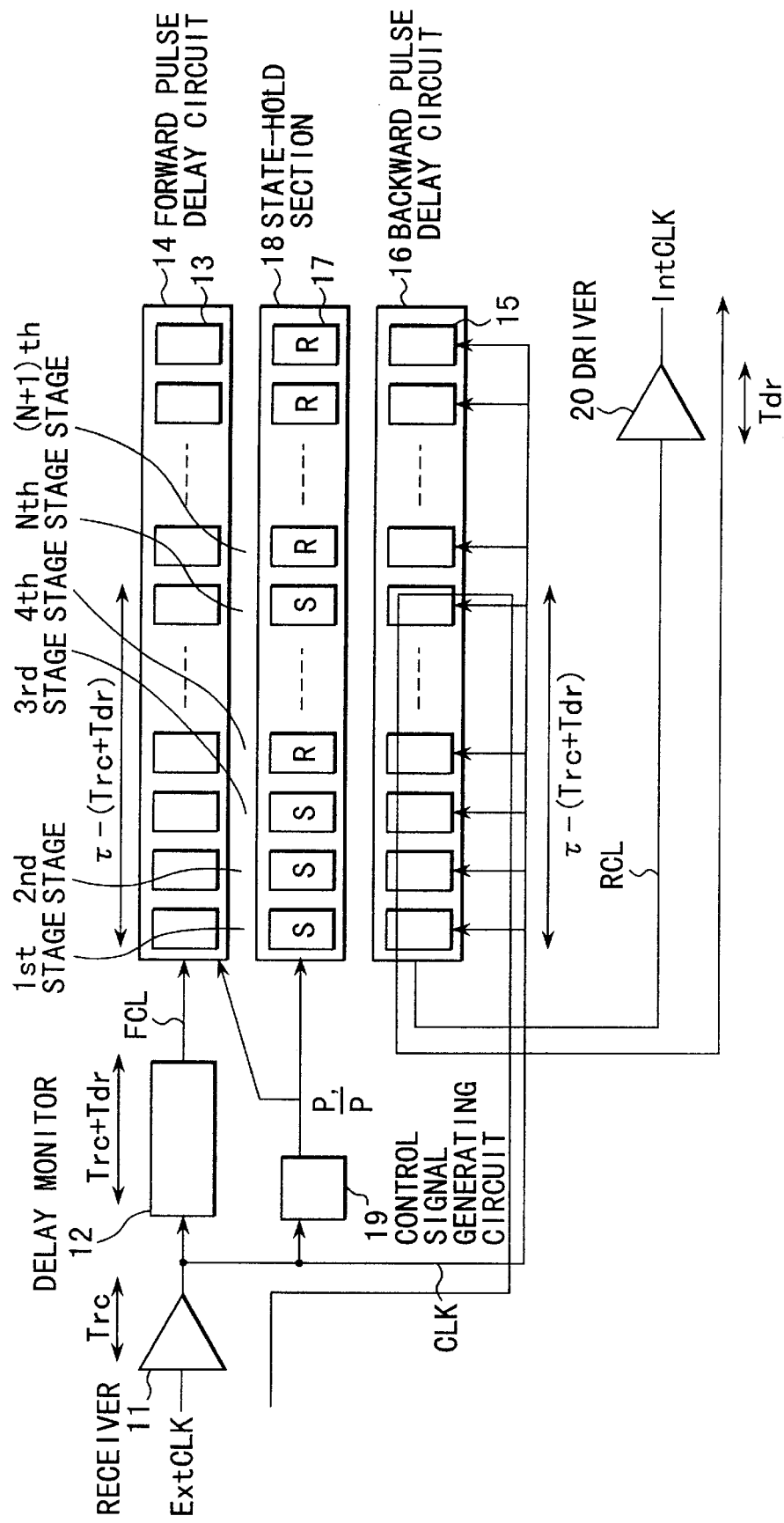
FIG. 1 is a block diagram showing a configuration of a conventional clock control circuit.
Figure 2:
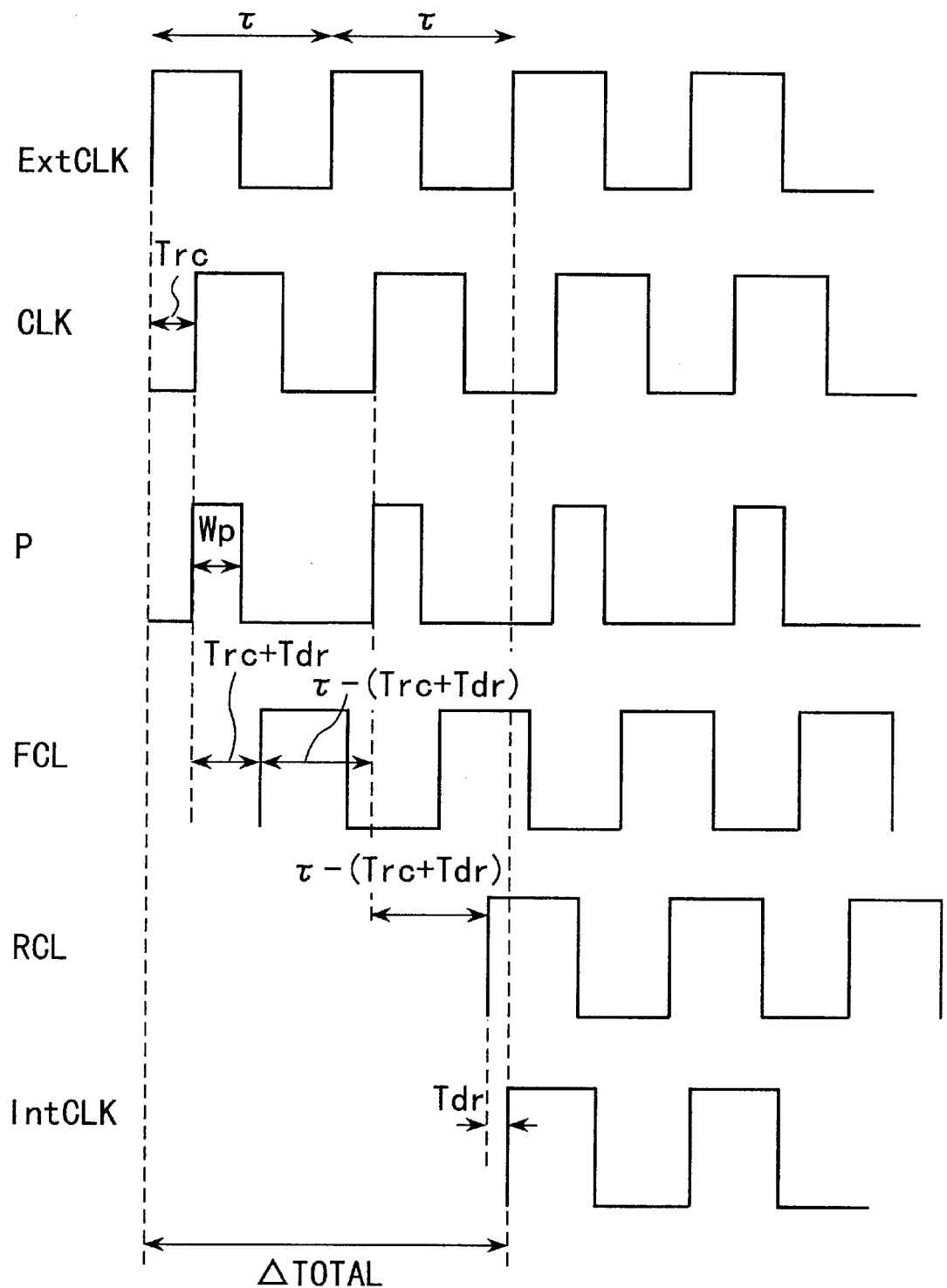
FIG. 2 is a timing chart for explaining the operating principle of the clock control circuit shown in FIG. 1.
Figure 3:
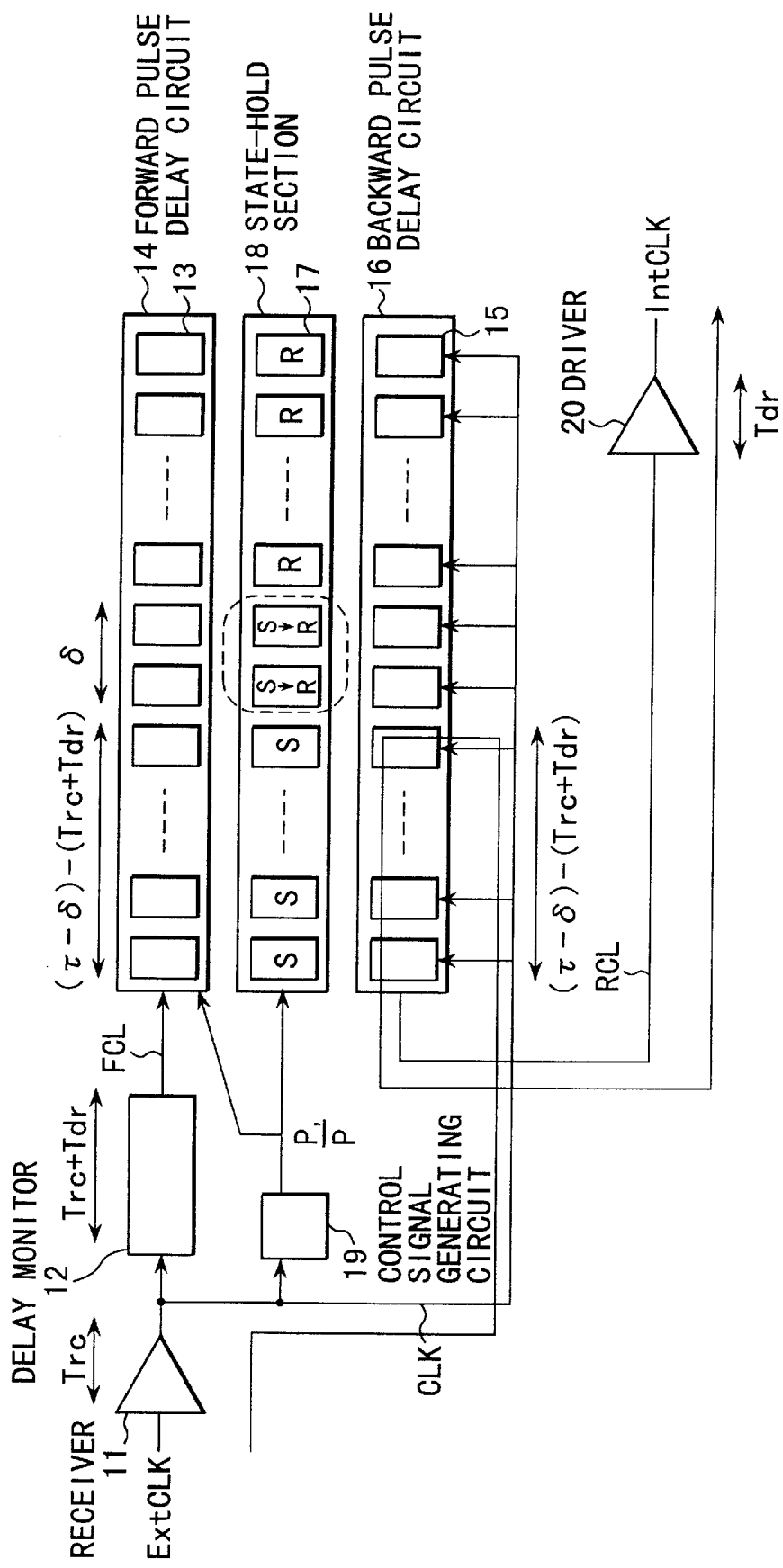
FIG. 3 is a block diagram for explaining the operation of the clock control circuit shown in FIG. 1.
Figure 4:
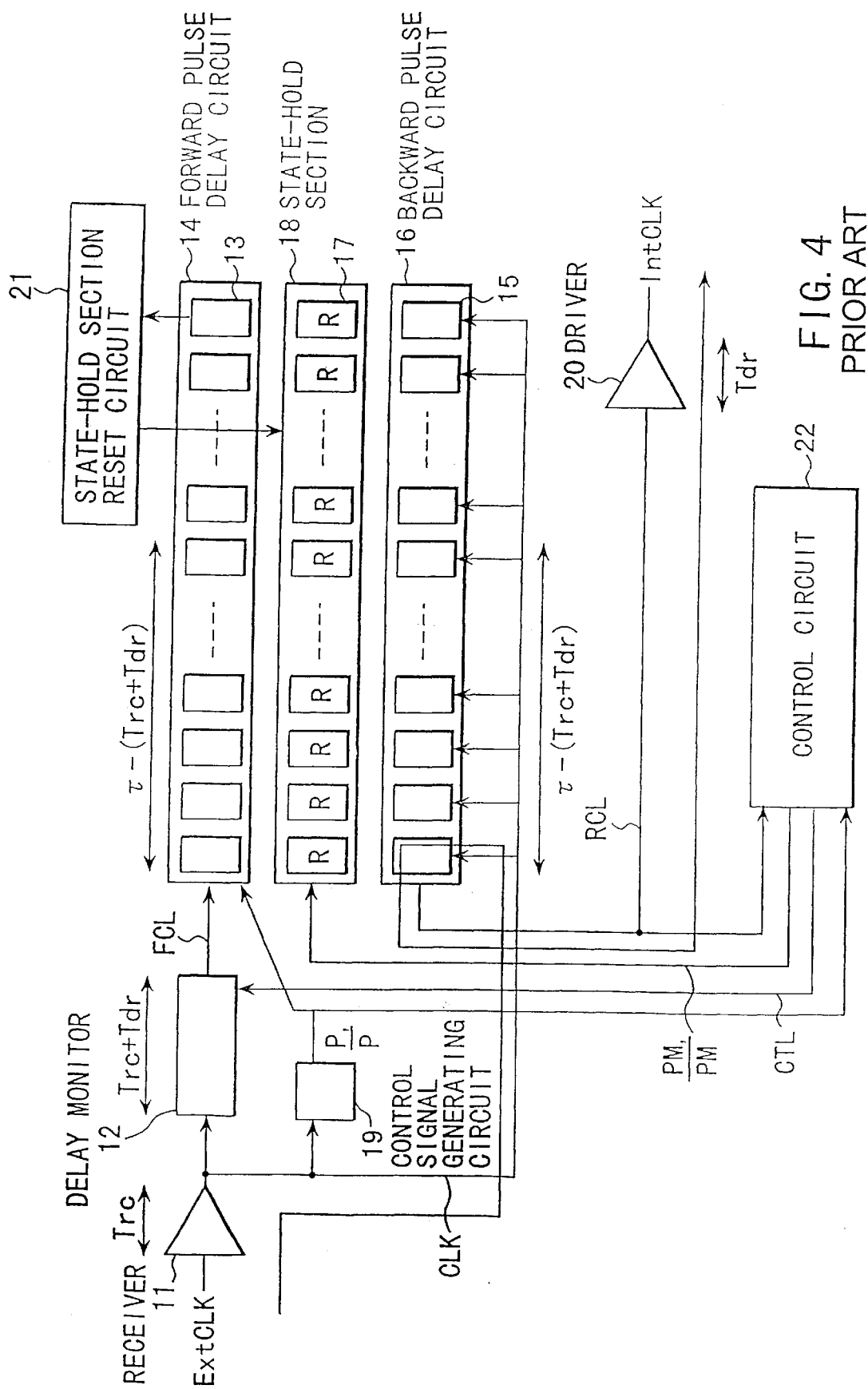
FIG. 4 is a block diagram showing a clock control circuit different from FIG. 1.
Figure 6:
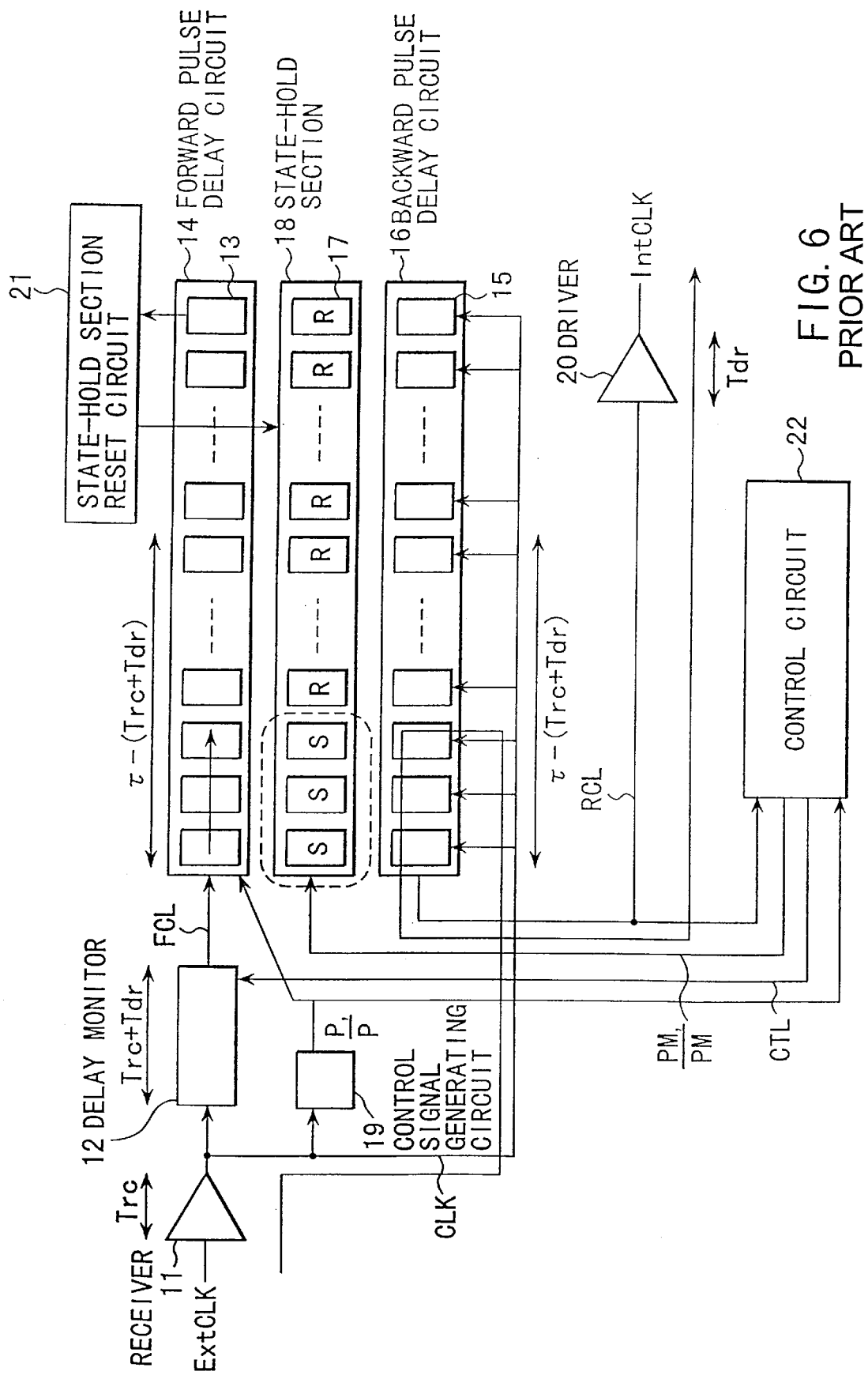
FIG. 6 is a block diagram for explaining the operation of the clock control circuit shown in FIG. 4.

The circuit according to this embodiment is different from the circuit shown in FIG. 4 or 6 in that an input stop circuit 23 is added to this embodiment.

The input stop circuit 23 has the function of stopping the input of the output pulse signal CLK from the clock receiver 11 to the backward pulse delay circuit 16 during a predetermined period from the start of supplying the external clock signal ExtCLK.

The external clock signal ExtCLK is shaped in waveform and amplified by the receiver 11, and output as a pulse signal CLK. The delay time in the clock receiver 11 is Trc.

The pulse signal CLK output from the receiver 11 is input to the delay monitor circuit 12 and the control signal generating circuit 19 while at the same time being input to the backward pulse delay circuit 16 through the input stop circuit 23.

The control signal generating circuit 19, upon receipt of the pulse signal CLK, outputs a control signal P having a pulse width Wp synchronous with the rise of the pulse signal CLK and a control signal /P complementary with the control signal P. As in the prior art, the pulse width Wp of the control signal P is set shorter than the period (Trc+Tdr) described above.

The delay monitor circuit 12 waits for a delay time (Trc+Tdr) equal to the sum of the delay time Trc of the receiver 11 and the delay time Tdr of the driver 20. Also, the pulse width of the pulse signal output from the delay monitor circuit 12 is adjusted in accordance with the control signal CTL output from the control circuit 22. The output pulse FCL from the delay monitor circuit 12 is input to the forward pulse delay circuit 14.

In the forward pulse delay circuit 14, a plurality of the delay circuits 13 connected in a multiplicity of stages in cascade transmit the forward pulse signal from the preceding stage to the succeeding stage when the control signal P is "L", and stops transmitting the forward pulse signal when the control signal P is "H".

The state-hold section 18 stores information of the transmission condition of the forward pulse signal in the forward pulse delay circuit 14 by each of the state-hold circuits 17, and controls the operation of the backward pulse delay circuit 16 based on the stored information in such a manner that the transmission time of the backward pulse is equal to the transmission time of the forward pulse signal. The state-hold circuits 17 in the state-hold section 18 are all initially reset, and those state-hold circuits 17 corresponding to the delay circuits 13 in the forward pulse delay circuit 14 where no forward pulse signal is transmitted remain reset. The state-hold circuits 17 corresponding to the delay circuits 13 in the forward pulse delay circuit 14 through which the forward pulse signal is transmitted, on the other hand, enters a set state. In accordance with the set/reset state of each state-hold circuit 17, the control signal generated in each state-hold circuit 17 is input to the backward pulse delay circuit 16.

A plurality of delay circuits 15 in the backward pulse delay circuit 16 controlled by the control signal from the state-hold circuits 17 corresponding to the set state apply the backward pulse signal transmitted from the delay circuits in the succeeding stage to the delay circuits in the preceding stage. The delay circuits 15 in the backward pulse delay circuit 16 controlled by the control signal from the state-hold circuits 17 corresponding to the reset state, on the other hand, output the output signal CLK2 from the input stop circuit 23 to the delay circuits in the preceding stage.

The state-hold section reset circuit 21 has the function of detecting the forward pulse signal output from the delay circuit in the last stage in the forward pulse delay circuit 14, and based on the detection result, resetting all the state-hold circuits 17 in the state-hold section 18.

In accordance with the backward pulse signal RCL and the control signal /P, the control circuit 22 outputs the control signal /PM for controlling the operation of the state-hold section 18 and the control signal CTL for adjusting the pulse width of the output pulse signal from the delay monitor circuit 12.

The input stop circuit 23 is supplied with the pulse signal CLK output from the clock receiver 11. This input stop circuit 23 includes a shift register 24 for outputting a signal QA and a two-input AND circuit 25 supplied with the output signal QA of the shift register 24 and the pulse signal CLK output from the receiver 11 for outputting the signal CLK2 corresponding to the two inputs.

The shift register 24, which is supplied with a "H" signal as an input, is a 1-bit shift register in which the pulse signal CLK rises to "H" first and then falls to "L", followed by outputting the "H" input signal as a signal QA. The AND circuit 25 outputs the pulse signal CLK from the receiver 11 as a clock signal CLK2 when the output signal QA of the shift register 24 is "H". When the output signal QA of the shift register 24 is "L", on the other hand, the signal CLK2 is kept "L" regardless of the output of the receiver 11.

Figure 10:
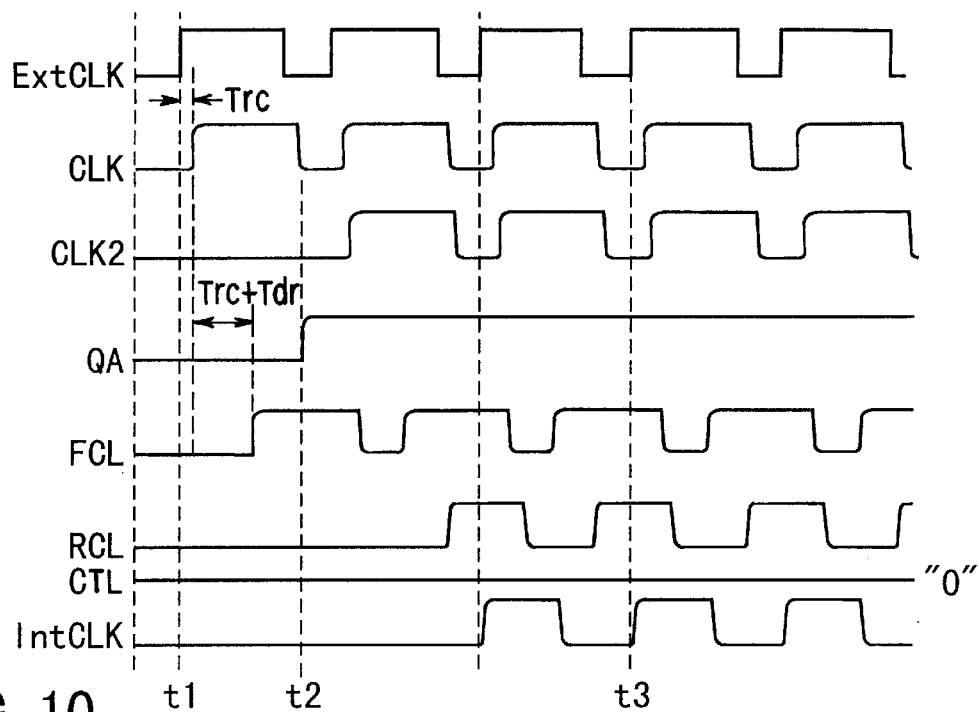
FIG. 10 is a timing chart showing an example of operation of the clock control circuit shown in FIG. 9.

FIG. 10 is a timing chart showing an example of the operation of the clock control circuit shown in FIG. 9.

The external clock ExtCLK, once started to be supplied, is shaped in waveform and amplified by the receiver 11 and output as a pulse signal CLK. Let Trc the delay time in the clock receiver 11. Then, as shown in FIG. 10, the pulse signal CLK is delayed by Trc behind the external clock signal ExtCLK. The pulse signal CLK output from the receiver 11 is input to the delay monitor circuit 12, and after being further delayed by (Trc+Tdr), output as a pulse signal FCL.

The output signal QA of the shift register 24 in the input stop circuit 23 remains "L" until the timing t2 before which the external clock signal ExtCLK rises to "H" initially at timing t1, then, after some delay, the output pulse signal CLK from the receiver 11 rises to "H", after which the external clock signal ExtCLK falls to "L" and after some delay, the output pulse signal CLK from the receiver 11 falls to "L".

At timing t2 when the output pulse signal CLK from the receiver 11 falls to "L", the output signal QA of the shift register 24 turns from "L" to "H". As a result, the backward pulse delay circuit 16 is supplied with the second and subsequent pulse signals CLK as a pulse signal CLK2 as shown in FIG. 10.

Thus, in the circuit of FIG. 4 or 6, the first pulse signal RCL which has thus far been output from the backward pulse delay circuit 16 as a signal corresponding to the first-input external clock signal ExtCLK ceases to be output.

Figure 7:
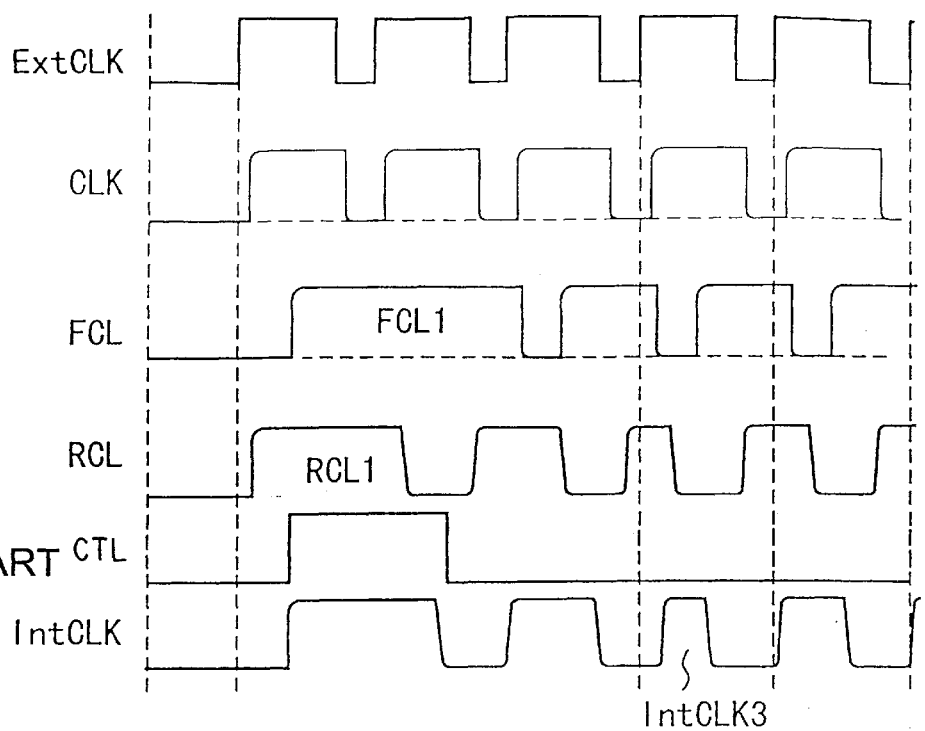
FIG. 7 is a timing chart showing an example of operation of the clock control circuit shown in FIG. 4.
Figure 8A:
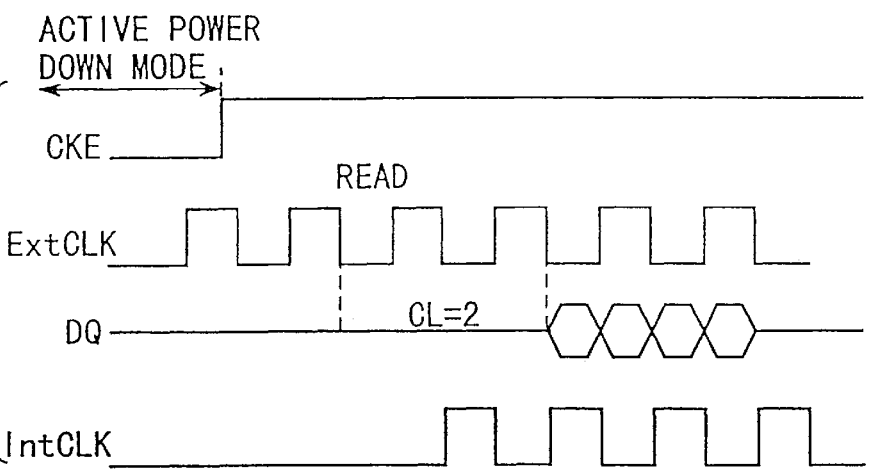
FIG. 8A is an example of the timing chart in power down mode of a synchronous DRAM.
Figure 8B:
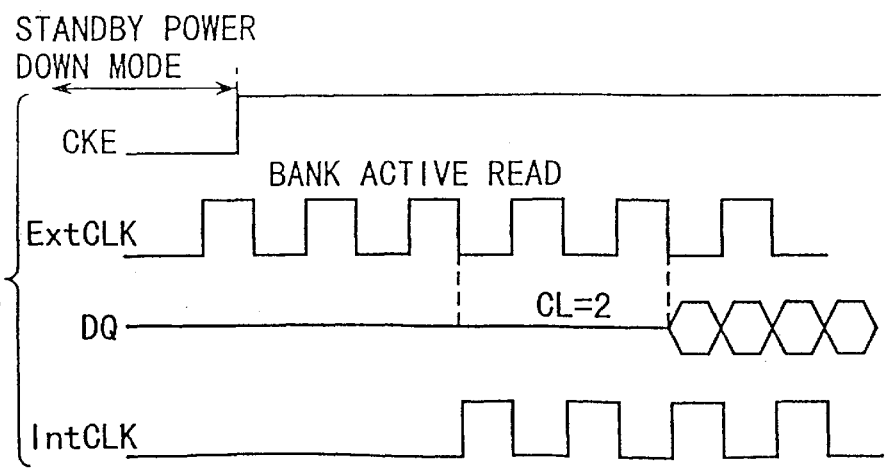
FIG. 8B is another example of the timing chart in power down mode of a synchronous DRAM.

Specifically, according to this embodiment, the first pulse signal CLK is cut off by the input stop circuit 23 and not input to the backward pulse delay circuit 16. As shown in FIG. 10, therefore, a pulse signal RCL having a long pulse width as RCL1 as shown in FIG. 7 is not output from the backward pulse delay circuit 16.

Figure 5:
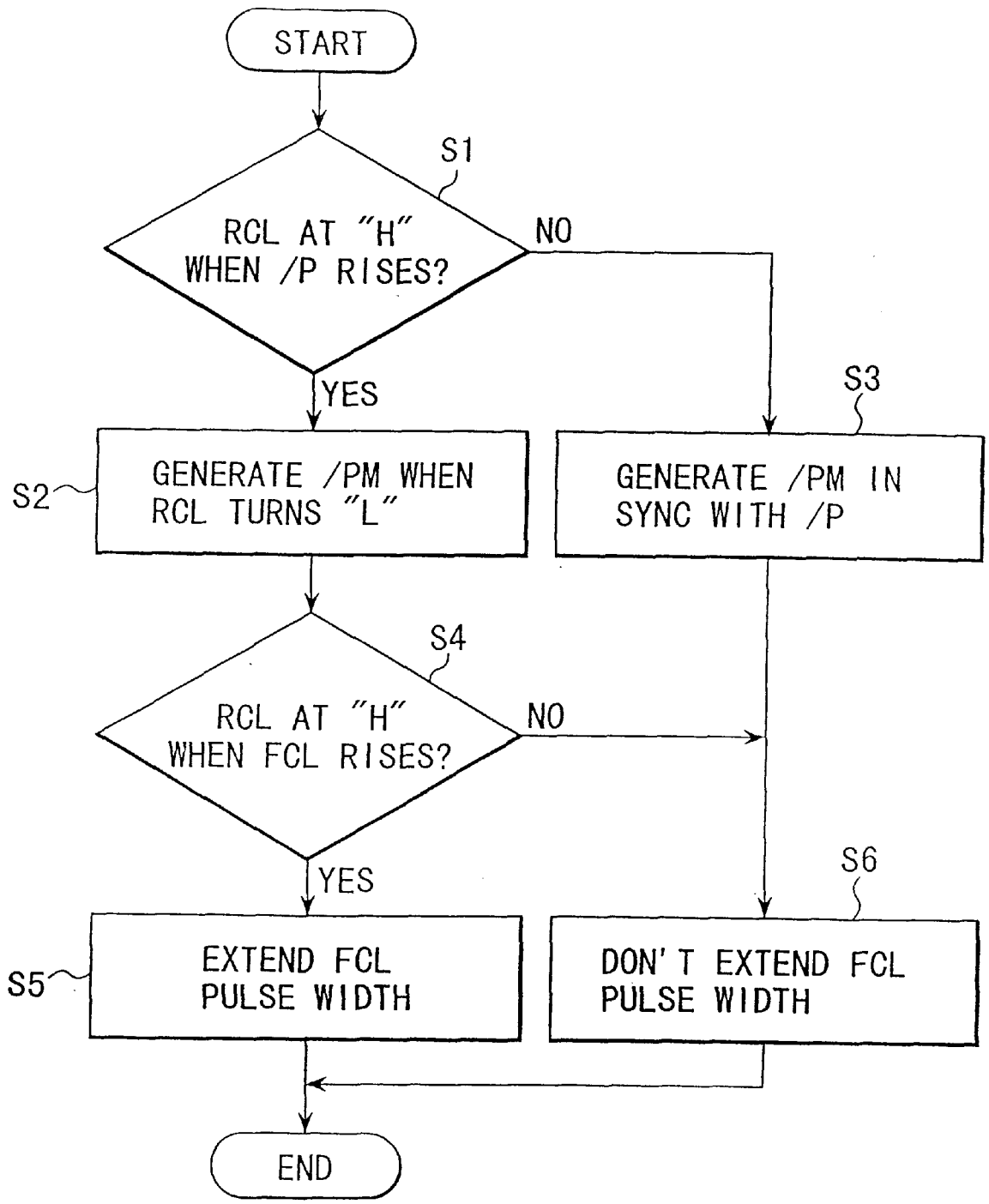
FIG. 5 is a flowchart for a state-hold section control circuit in the clock control circuit shown in FIG. 4.

In the process, the control circuit 22 does not generate a control signal CTL as an extension of the pulse signal FCL based on the control flow of FIG. 5, and therefore the pulse width of the first pulse signal FCL is not extended and overlapped with the next pulse signal FCL.

Thus, the internal clock signal IntCLK (the internal clock signal corresponding to the fourth clock of the external clock signal, i.e. the internal clock signal in synchronism with the timing t3 in FIG. 10) established as the result of transmission of the second clock of the pulse signal FCL to the forward pulse delay circuit 14 is synchronized with the external clock signal ExtCLK.

Now, a specific circuit configuration of each circuit included in the clock control circuit shown in FIG. 9 will be explained.

Figure 11:
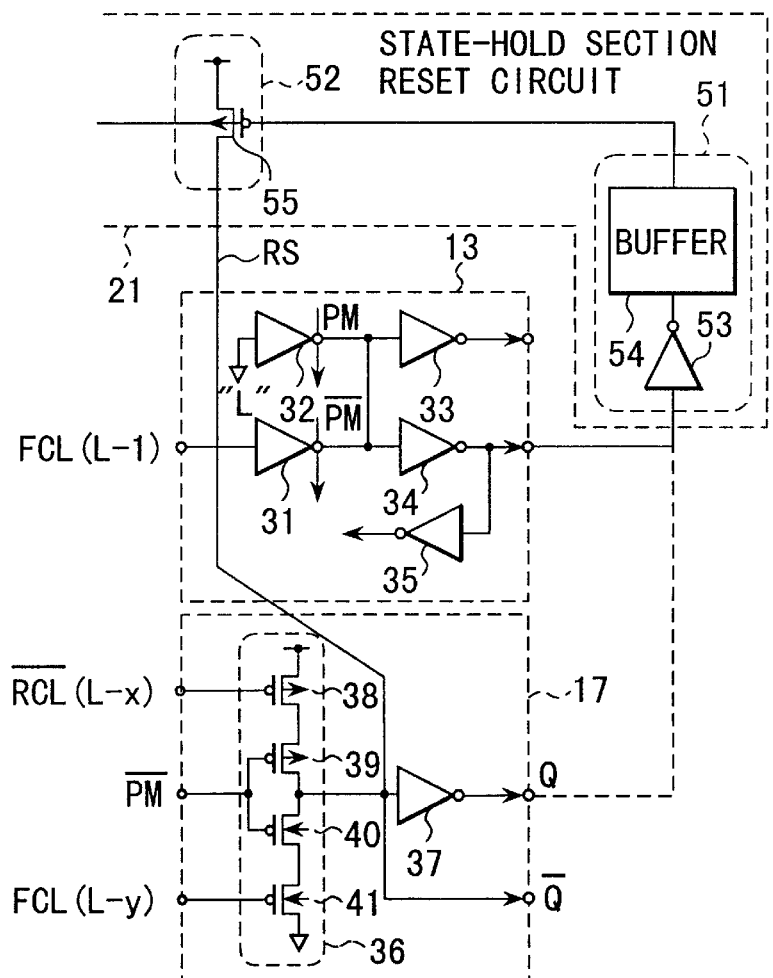
FIG. 11 is a circuit diagram showing a specific example of the configuration of a state-hold section reset circuit, a delay circuit in the last stage of the forward pulse delay circuit and a state-hold circuit in a state holding section corresponding to the delay circuit.

FIG. 11 shows a specific example of the configuration of the state-hold section reset circuit 21, the delay circuit 13 in the last stage in the forward pulse delay circuit 14 and the state-hold circuit 17 in the state-hold section 18 shown in FIG. 9.

In FIG. 11, the delay circuit 13 in the last stage in the forward pulse delay circuit 14 is configured with two clocked inverters 31, 32 and three inverters 33 to 35. The clocked inverter 31 is activated when the control signal /PM is "H", and outputs the forward pulse signal FCL(L−1) from the delay circuit 13 in the preceding stage to the two inverters 33, 34. The clocked inverter 32 is kept supplied with a "L" signal. This clocked inverter 32 is activated when the control signal /PM is "H", inverts the "L" input signal, and outputs it to the two inverters 33, 34. The inverters 33, 34 outputs by inverting the inputs thereto, respectively. The inverter 35 having an input node connected to the output node of the inverter 34 is for adjusting the load.

In the delay circuit 13 having this configuration, when the control signal /PM is "H", the clocked inverter 32 is turned on, the "L" input signal is inverted, and the output of the clocked inverter 32 is output by being inverted in the inverters 33, 34.

When the control signal /PM is "H", on the other hand, the clocked inverter 31 is turned on, the forward pulse signal FCL(L−1) from the preceding stage is inverted, and the output of the clocked inverter 32 is inverted in the inverters 33, 34.

In view of the fact that the delay circuit 13 is in the last stage, the output of the inverters 33, 34 is not transmitted to subsequent stages. As for the other delay circuits 13 not shown, however, the outputs of the inverters 33, 34 are transmitted to the delay circuits in the succeeding stages.

The last-stage state-hold circuit 17 in the state-hold section 18 includes a clocked inverter 36 and an inverter 37. The clocked inverter 36 is configured with two pMOS transistors 38, 39 and two nMOS transistors 40, 41 each having the source and the drain thereof connected in series between a power node and the ground node. The gate of the pMOS transistor 38 is supplied with the backward pulse signal /RCL(L−x) from a predetermined stage of the backward pulse delay circuit 15. Also, the gate of the pMOS transistor 39 and the nMOS transistor 40 is supplied with the control signal /PM. Further, the gate of the nMOS transistor 41 is supplied with the forward pulse signal FCL(L−y) from a predetermined stage of the forward pulse delay circuit 14.

The output of the clocked inverter 36 is input to the inverter 37, and the output signal Q of the inverter 37 and the input node signal /Q of the inverter 37 are output to the backward pulse delay circuit 16.

The state-hold section reset circuit 21 includes a forward pulse detect circuit 51 and a reset circuit 52. The forward pulse detect circuit 51 detects that the forward pulse signal is output from the delay circuit 13 in the last stage and outputs a detect signal to the reset circuit 52. This forward pulse detect circuit 51 includes an inverter 53 and a buffer 54.

The forward pulse signal output from the delay circuit 13 in the last stage of the forward pulse delay circuit 14 is inverted in the inverter 53, and input to the buffer 54. The buffer 54 has a driving force capable of driving all the reset circuits 52, and can output a signal of a sufficient pulse width to reset the state-hold circuits 17 in the state-hold section 18.

The reset circuits 52 are provided in the same number as the state-hold circuits 17 in the state-hold section 18, one reset circuit 52 being arranged for each state-hold circuit 17.

Each reset circuit 52 is configured with a pMOS transistor 55 having an end of the source and the drain thereof connected to a power node, and the other end thereof connected to the input node of the inverter 37 in the corresponding state-hold circuit 17. The gate of each transistor 55 is supplied with the output of the forward pulse detect circuit 51.

Once the forward pulse signal FCL is transmitted to the delay circuit 13 in the last stage of the forward pulse delay circuit 14, the output of the inverter 53 in the state-hold reset circuit 21 falls to "L" after the rise of the forward pulse, after which the pMOS transistor 55 turns on. As a result, the input node signal of the inverter 37 in the state-hold circuit 17 rises to "H", and the output signal Q of the inverter 37 falls to "L", thereby resetting the state-hold circuit 17.

Figure 12:
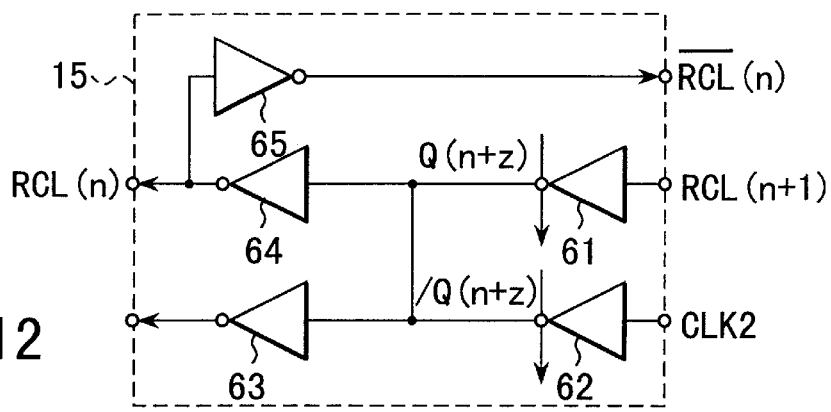
FIG. 12 is a circuit diagram showing a specific example of configuration of a delay circuit in the Nth stage in the backward pulse delay circuit of FIG. 9.

FIG. 12 shows a specific example of the configuration of the Nth-stage delay circuit 15 in the backward pulse delay circuit 16. This delay circuit 15 includes two clocked inverters 61, 62, and three inverters 63 to 65. The clocked inverter 61 is supplied with the backward pulse signal RCL(n+1) output from the delay circuit 15 in the succeeding (n+1)th stage, and the clocked inverter 62 is supplied with the pulse signal CLK2 output from the input stop circuit 23.

The clocked inverter 61 is activated when the control signal Q(n+z) output from the state-hold circuit 17 in the (n+z)th stage is "H". The clocked inverter 61, when activated, inverts the forward pulse signal FCL(n+1) from the delay circuit 13 in the succeeding stage, and outputs the resulting signal to the two inverters 63, 64. The clocked inverter 62, on the other hand, is activated when the control signal /Q(n+z) is "H". The clocked inverter 62, when activated, inverts the pulse signal CLK2 and outputs the resulting signal to the two inverters 63, 64. The inverters 63, 64 invert and output the input signals. The output signal of the inverter 64 is transmitted to the delay circuit 15 in the preceding stage as a backward pulse signal RCL(n). In this case, too, the inverter 65 connected to the output node of the inverter 64 is for adjusting the load.

In the delay circuit 15 in the backward pulse delay circuit 16 supplied with the control signals Q, /Q corresponding to the reset state, the clocked inverter 62 is activated, the pulse signal CLK2 is inverted by the clocked inverter 62, and after being further inverted by the inverter 64, output to the preceding stage as a backward pulse signal RCL(n).

In the delay circuit 15 supplied with the control signals Q, /Q corresponding to the set state, on the other hand, the clocked inverter 61 is activated, and the backward pulse signal RCL(n+1) from the succeeding stage is inverted by the clocked inverter 61, and after being further inverted by the inverter 64, output to the preceding stage as a backward pulse signal RCL(n).

In FIGS. 11 and 12, the reference character "x" designates protective means against the jitter, and the reference characters "y" and "z" are for offsetting the delay time from the timing upon the lapse of the period {τ−(Trc+Tdr)} after the transmission of the forward pulse signal is started to the time point when the forward pulse signal stops and the transmission of the backward pulse starts. In the drawing, "n" is an integer not less than 1, and "x", "y" and "z" are integers.

Figure 13:
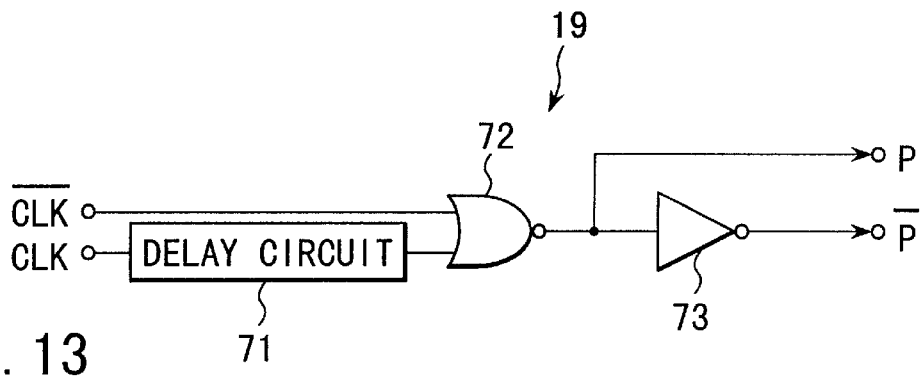
FIG. 13 is a circuit diagram showing a specific example of the configuration of a control signal generating circuit shown in FIG. 9.

FIG. 13 shows a specific example of the configuration of the control signal generating circuit 19 for outputting complementary control signals P, /P upon receipt of the output pulse CLK from the delay monitor circuit 12. This circuit includes a delay circuit 71 for delaying the pulse signal CLK for a predetermined period, a NOR circuit 72 supplied with the output signal of the delay circuit 71 and the pulse signal /CLK of a level complementary with the pulse signal CLK, and an inverter 73 for inverting the output of the NOR circuit 72.

The control signal P is output from the NOR circuit 72, and the control signal /P of a level complementary with the control signal P is output from the inverter 73.

Figure 14:
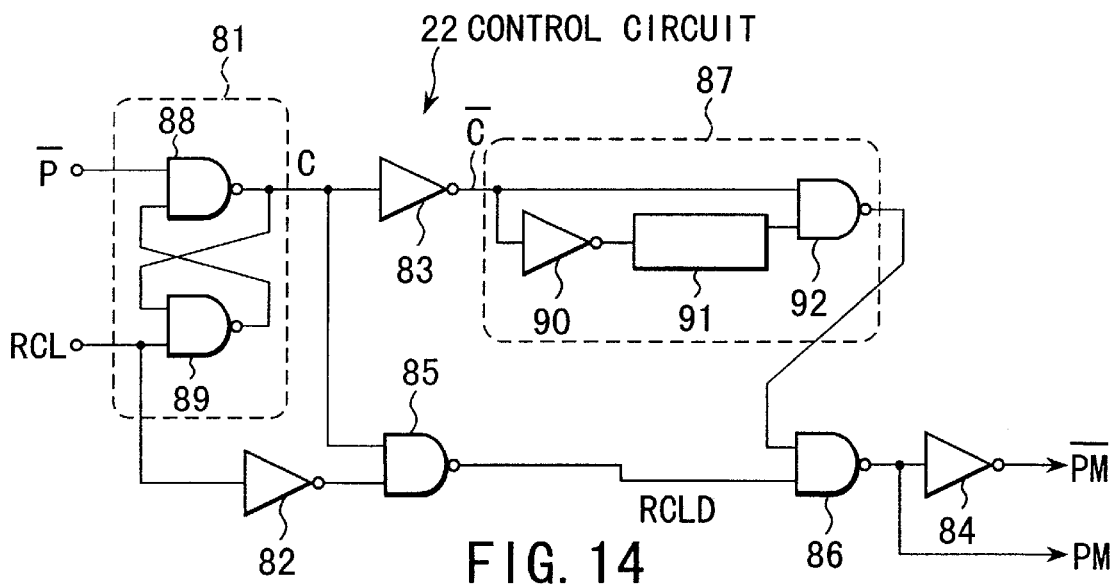
FIG. 14 is a circuit diagram showing a specific example of the configuration of the control circuit shown in FIG. 9.

FIG. 14 shows a specific example of the configuration of the control circuit 22. This circuit is configured with a flip-flop circuit 81, inverters 82 to 84, NAND circuits 85, 86 and a pulse generating circuit 87.

The flip-flop circuit 81 includes two 2-input NAND circuits 88, 89. The control signal /P and the backward pulse RCL are supplied as one of the inputs to the NAND circuits 88, 89, respectively.

The output signal C of the flip-flop circuit 81 becomes "H" when the control signal /P is "L" and the backward pulse signal RCL is "H". On the contrary, when the control signal /P is "H" and the backward pulse signal RCL is "L", the output signal C falls to "L". When the control signal /P and the backward pulse signal RCL are both "H", the output signal C remains at the same level.

The inverter 82 inverts and outputs the backward pulse signal RCL to one of the inputs of the NAND circuit 85. The other input node of the NAND circuit 85 is supplied with the output signal C of the flip-flop circuit 81. The NAND circuit 85 outputs a "L" signal when the output signal of the inverter 82 and the output signal C of the flip-flop circuit 81 are both "H". The output signal of the NAND circuit 85 is supplied to one of the input nodes of the NAND circuit 86 as a signal RCLD.

The output signal C of the flip-flop circuit 81 is input also to the inverter 83. The inverter 83 inverts the signal C and supplies the inverted signal to the pulse generating circuit 87.

The pulse generating circuit 87 is configured with an inverter 90, a delay circuit 91 and a NAND circuit 92. The output signal /C of the inverter 83 is inverted by the inverter 90 and delayed by the delay circuit 91. The output signal of the delay circuit 91 is supplied to the NAND circuit 92 together with the signal /C. The output signal of the NAND circuit 92 is supplied to the NAND circuit 86. The control signal PM is output from the NAND circuit 86, while the control signal /PM is output from the inverter 84 for inverting the signal PM.

Figure 15:
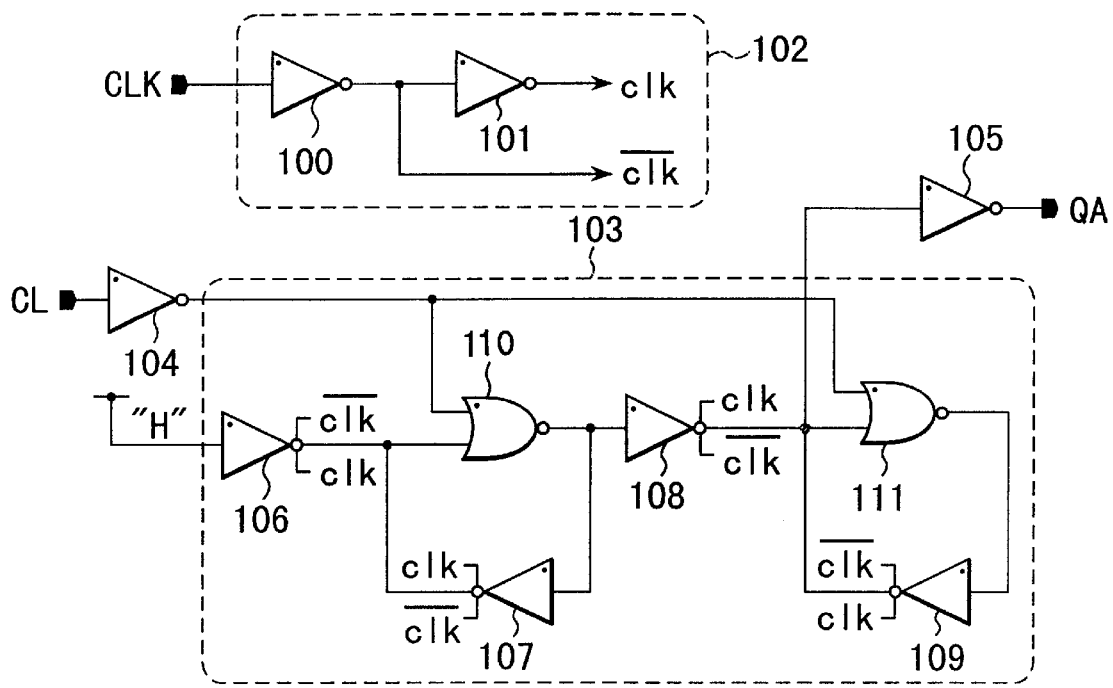
FIG. 15 is a circuit diagram showing a specific example of the configuration of the shift register circuit in the input stop circuit shown in FIG. 9.

FIG. 15 shows a specific example of the configuration of the shift register circuit 24 in the input stop circuit 23. This circuit includes a pulse generating circuit 102 having two inverters 100, 101 for outputting a pulse signal clk in phase with the pulse signal CLK and a pulse signal /clk in opposite phase with the pulse signal CLK, respectively. Further, in addition to the pulse generating circuit 102, this circuit includes a 1-bit shift register 103 and two inverters 104, 105.

The 1-bit shift register 103 includes four clocked inverters 106 to 109 and two NOR circuits 110, 111. The clocked inverter 106 is kept supplied with a "H" input signal. This clocked inverter 106 turns on when the pulse signal clk is "H" (when the pulse signal /clk is "L"), inverts the "H" signal supplied as an input signal thereto, and supplies it to one of the inputs of the NOR circuit 110. The clocked inverter 107 is supplied with the output signal of the NOR circuit 110 as an input thereto. The clocked inverter 107 turns on when the pulse signal /clk is "H" (when the signal pulse clk is "L"), inverts the output signal of the NOR circuit 110 supplied as an input signal thereto, and feeds back the inverted signal to one of the inputs of the NOR circuit 110.

The clocked inverter 108 is supplied with the output signal of the NOR circuit 110 as an input thereto. The clocked inverter 108 turns on when the pulse signal /clk is "H" (when the pulse signal clk is "L"), inverts the output signal of the NOR circuit 110 supplied as an input signal thereto, and supplies the inverted signal as one of the inputs to the NOR circuit 111. The clocked inverter 109 is supplied with the output signal of the NOR circuit 111 as an input thereto. The clocked inverter 109 turns on when the pulse signal clk is "H" (when the pulse signal /clk is "L"), inverts the output signal of the NOR circuit 111 supplied as an input signal thereto, and feeds back the inverted signal to one of the inputs to the NOR circuit 111.

The inverter 104 is supplied with a clear signal CL, and the output signal of the inverter 104 is supplied to the other input of each of the two NOR circuits 110.

In the shift register circuit 24 having this configuration, the clocked inverter 106 turns on in synchronism with the first rise of the pulse signal CLK, so that the output signal of the clocked inverter 106 becomes "L". If the clear signal CL is "H" and the clear state is canceled, the output signal of the clocked inverter 106 falls to "L", after which the output of the NOR circuit 110 rises to "H". At this timing, the clocked inverter 106 is not turned on and therefore the output of the NOR circuit 110 is not shifted to QA.

Then, when the clocked inverter 107 turns on in synchronism with the first fall of the pulse signal CLK, the output of the NOR circuit 110 is fed back to the input thereof, and therefore the output of the NOR circuit 110 is latched by the feedback loop including the NOR circuit 110 and the clocked inverter 107.

In synchronism with the first fall of the pulse signal CLK, the clocked inverter 108 turns on so that the output signal of the clocked inverter 108 turns "L". Also, the output signal of the clocked inverter 108 is inverted by the inverter 105, and the output signal QA turns "H". Specifically, the "H" signal supplied to the clocked inverter 106 is shifted to the signal QA after the pulse signal CLK first rises and then falls to "L".

In other words, the signal QA remains at "L" until the end of the period during which the first pulse of the pulse signal CLK is completely output, and rises to "H" only after the first pulse of the pulse signal CLK is completely output. Subsequently, the shift operation of the "H" signal supplied to the clocked inverter 106 is repeated. As a result, after that, the control signal QA maintains the "H" state as shown in the timing chart of FIG. 10.

The AND circuit 25 in the input stop circuit 23 supplied with the control signal QA outputs the pulse signal CLK only after the control signal QA turns "H". Therefore, as explained with reference to FIG. 10 above, the pulse signal CLK in the first cycle is not output as the pulse signal CLK2.

When the "L" clear signal CL is input to the inverter 104, the output signal of the inverter 104 turns "H", so that the output signals of the NOR circuits 110, 111 turn "L"

regardless of the output signals of the clocked inverters 106, 108. Thus, the control signal QA returns to the initial "L" state. As a result, the input stop circuit 23 stops supplying the external clock signal ExtCLK to stand by for the restart of supply.

Now, a second embodiment of the invention will be explained with reference to FIG. 16.

Figure 17:
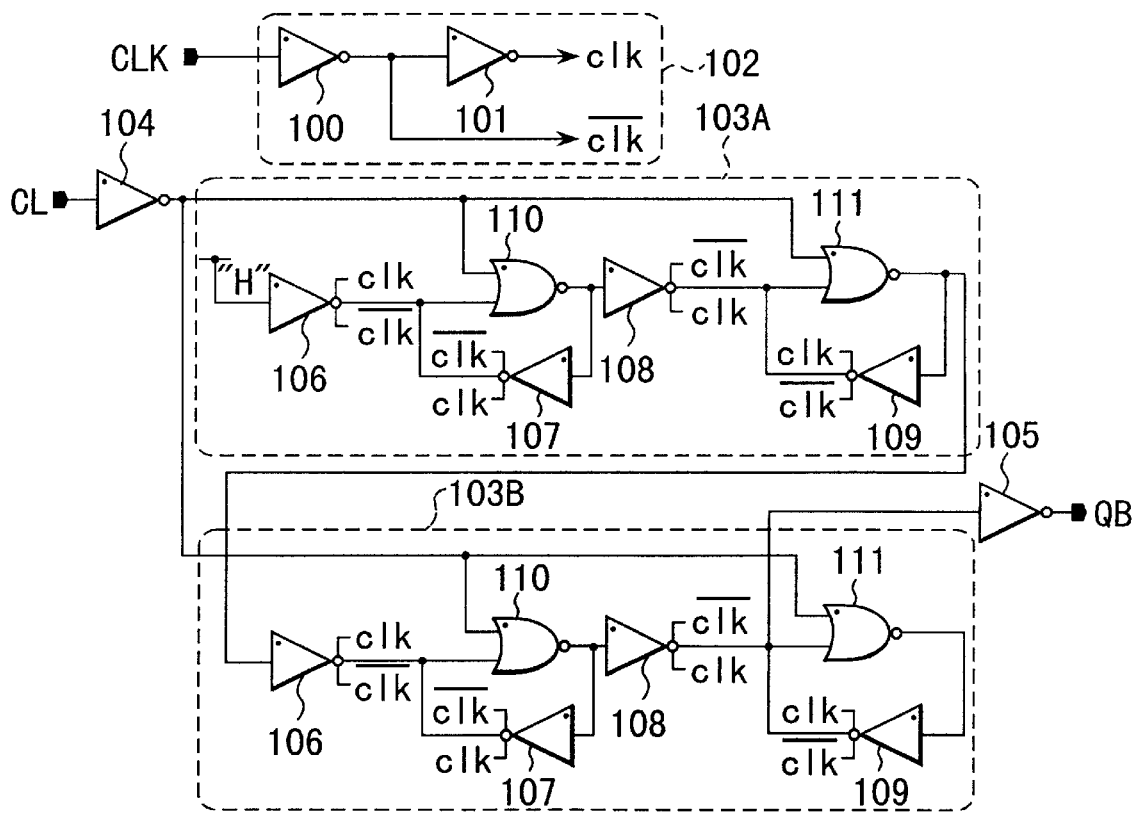
FIG. 17 is a circuit diagram showing a specific example of the configuration of the shift register circuit in the input stop circuit shown in FIG. 16.
Figure 16:
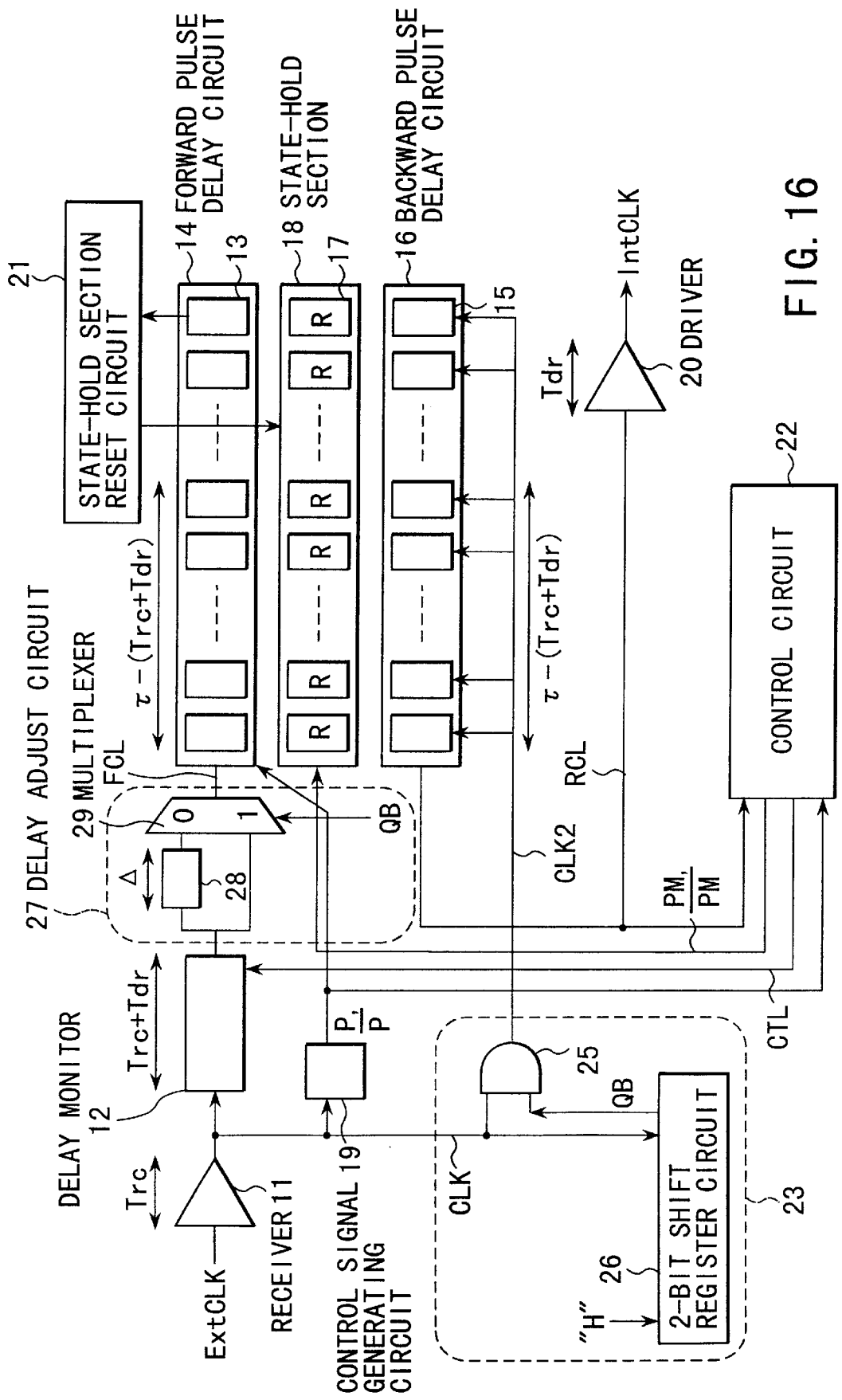
FIG. 16 is a block diagram showing the configuration of the clock control circuit according to a second embodiment of the invention.

The clock control circuit shown in FIG. 16 is different from the circuit of FIG. 9 in that the shift register 24 for shifting one bit in the input stop circuit 23 is replaced by a shift register circuit 26 configured as shown in FIG. 17 for shifting two bits, and in that a delay control circuit 27 is newly interposed between the delay monitor circuit 12 and the forward pulse delay circuit 14. The output signal QB from the shift register 26 for shifting two bits is applied to the AND circuit 25.

The shift register circuit 26 shown in FIG. 17, like the corresponding one shown in FIG. 15, includes a pulse generating circuit 102 having two inverters 100, 101 for outputting a pulse signal clk in phase with the pulse signal CLK and a pulse signal /clk in opposite phase from the pulse signal CLK, 1-bit shift registers 103A, 103B having four clocked inverters 106 to 109 and two NOR circuits 110, 111 like the preceding 1-bit shift register 103, and two inverters 104, 105.

In the preceding 1-bit shift register 103, the clocked inverters 106, 109 are activated when the pulse signal /clk turns "H", and the clocked inverters 107, 108 are turned on when the pulse signal /clk turns "H".

In the case of the 1-bit shift registers 103A, 103B, on the other hand, the clocked inverters 106, 109 are turned on when the pulse signal /clk is "H", while the clocked inverters 107, 108 are turned on when the pulse signal clk is "H".

The delay control circuit 27 includes a delay circuit 28 for delaying the output pulse of the delay monitor circuit 12 by a predetermined period Δ, and a multiplexer 29 supplied with the delayed output of the delay circuit 28 and the output pulse signal of the delay monitor circuit 12 for selectively outputting the two inputs in accordance with the control signal QB described above.

Now, the operation of the clock control circuit having the configuration shown in FIG. 16 will be explained with reference to the timing charts of FIGS. 18 and 19.

The shift register 26 of the input stop circuit 23 is for shifting the input "H" signal by two bits of the pulse signal CLK. As shown in FIG. 18, the output signal QB turns from "L" to "H" after the second turn from "L" to "H" of the pulse signal CLK.

The pulse signal CLK2 input to the backward pulse delay circuit 16 is an AND logic signal of the AND circuit 25 obtained from the output pulse signal CLK of the receiver 12 and the output signal QB of the shift register 26. Thus, when the signal QB is "L" (before the timing t2 in FIG. 18), the pulse signal CLK2 turns "L", and after the signal QB turns "H" (at and after t2), the pulse signal CLK is output from the input stop circuit 23 as a pulse signal CLK2.

Thus, as in the first embodiment, the problem is obviated that the internal clock signal cannot be synchronized with the external clock signal at the fourth clock after the supply of the external clock signal.

Figure 18:
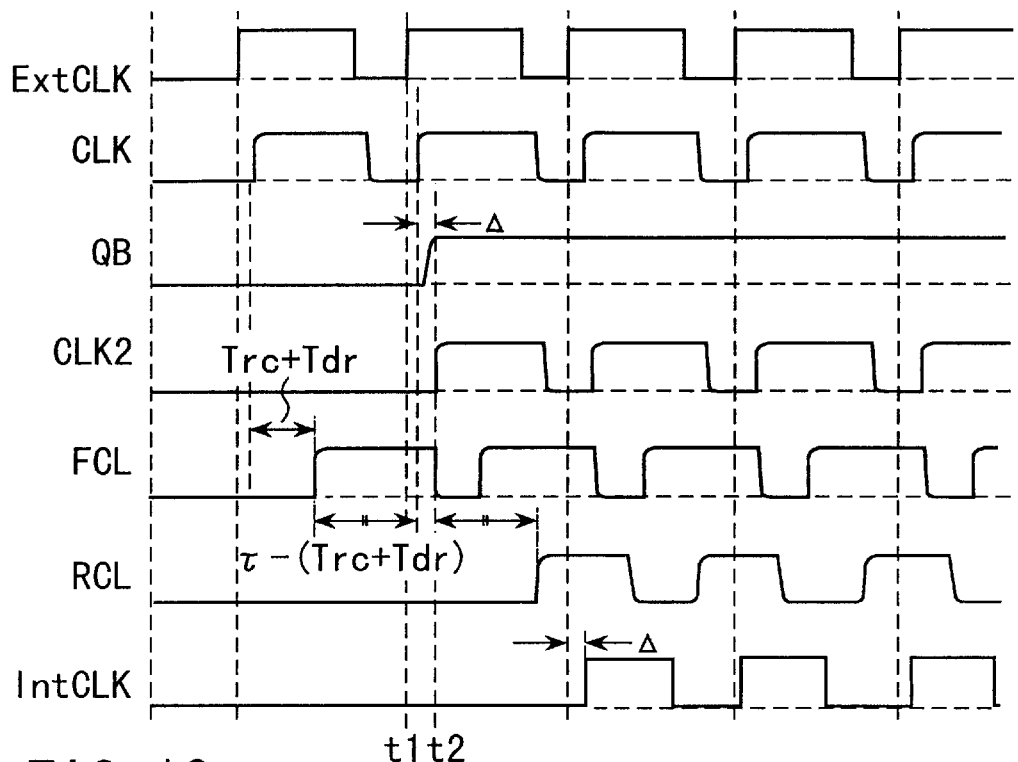
FIG. 18 is a timing chart showing an example of the operation of the clock control circuit shown in FIG. 16.
Figure 19:
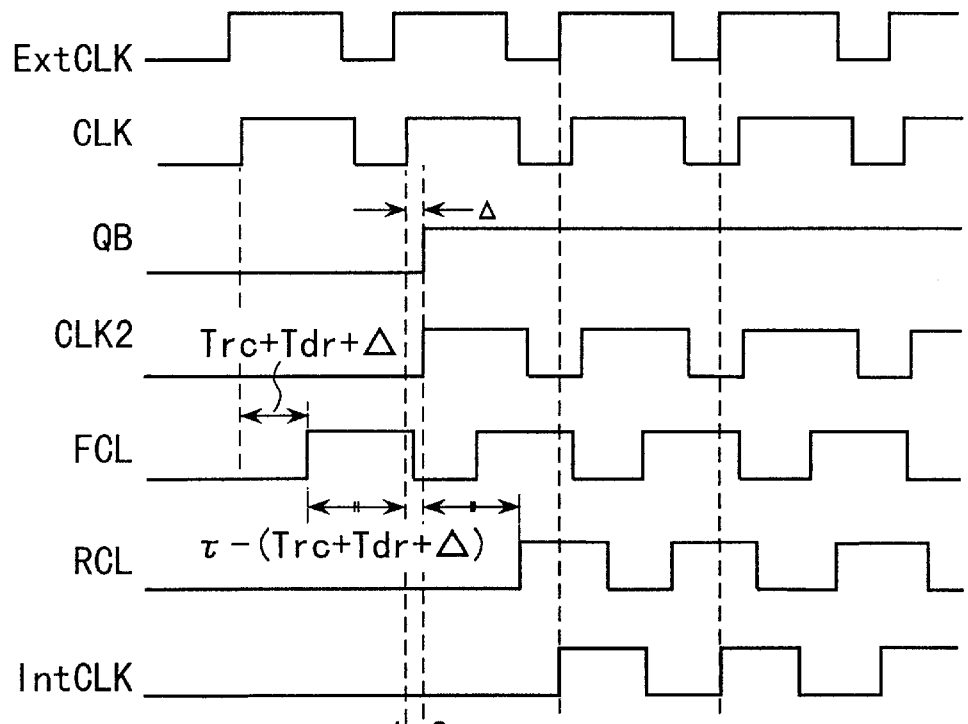
FIG. 19 is a timing chart showing an example of the operation of the clock control circuit shown in FIG. 16.

In view of the fact that the shift register circuit 26 in the input stop circuit 23 is for shifting two bits, however, direct supply of the output of the delay monitor circuit 12 to the forward pulse delay circuit 14 would lead to the phenomenon that the sum A of the signal delay time of the clocked inverter 108 in the shift register circuit 26 and the inverter 105 shown in FIG. 17 is undesirably transmitted as it is from the pulse signal CLK to the pulse signal CLK2 as shown in FIG. 18. As a consequence, the internal clock signal IntCLK first output would be delayed behind the external clock signal ExtCLK by the delay time A.

For this reason, the delay control circuit 27 is newly provided, so that the pulse delayed by a predetermined time Δ in the delay circuit 28 behind the output of the delay monitor circuit 12 is selected by the multiplexer 29 only in the first cycle, and then supplied to the forward pulse delay circuit 14. In this way, as shown in the timing chart of FIG. 19, the first internal clock signal IntCLK is also synchronized with the external clock signal ExtCLK.

Figure 20:
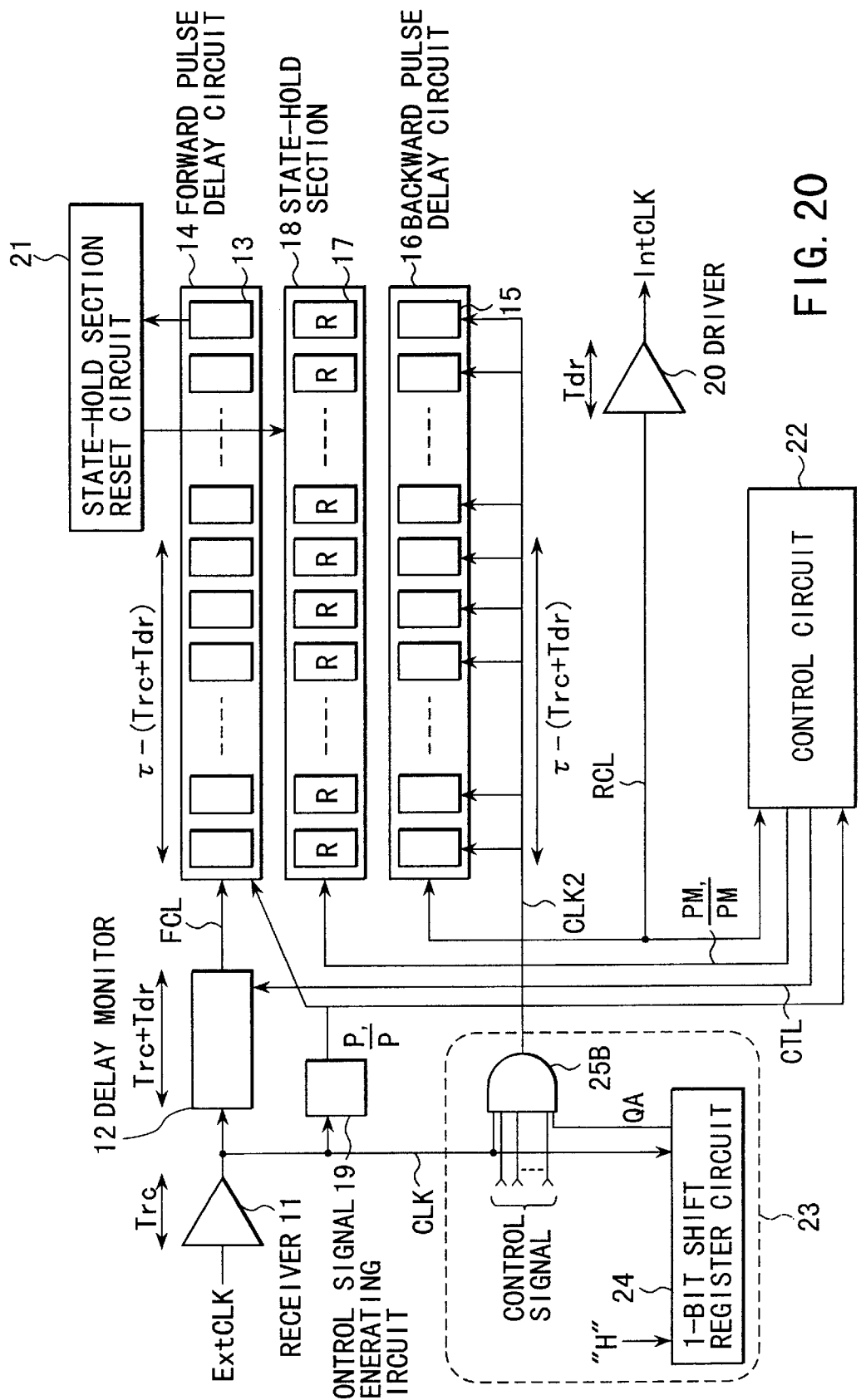
FIG. 20 is a block diagram showing a configuration of the clock control circuit according to a third embodiment of the invention.

FIG. 20 shows a configuration of the clock control circuit according to a third embodiment of the invention. The clock control circuit according to this embodiment is different from the clock control circuit according to the first embodiment shown in FIG. 9 only in that an AND circuit 25B supplied with two or more inputs has replaced the two-input AND circuit 25 in the input stop circuit 23.

As the result of providing the multi-input AND circuit 25B and inputting an external control signal in addition to the output signal QA from the shift register circuit 24 to the AND circuit 25B, the period during which the pulse signal CLK2 is output from the input stop circuit 23 is determined based on the control signal. Thus, a more versatile control operation is made possible.

Figure 21:
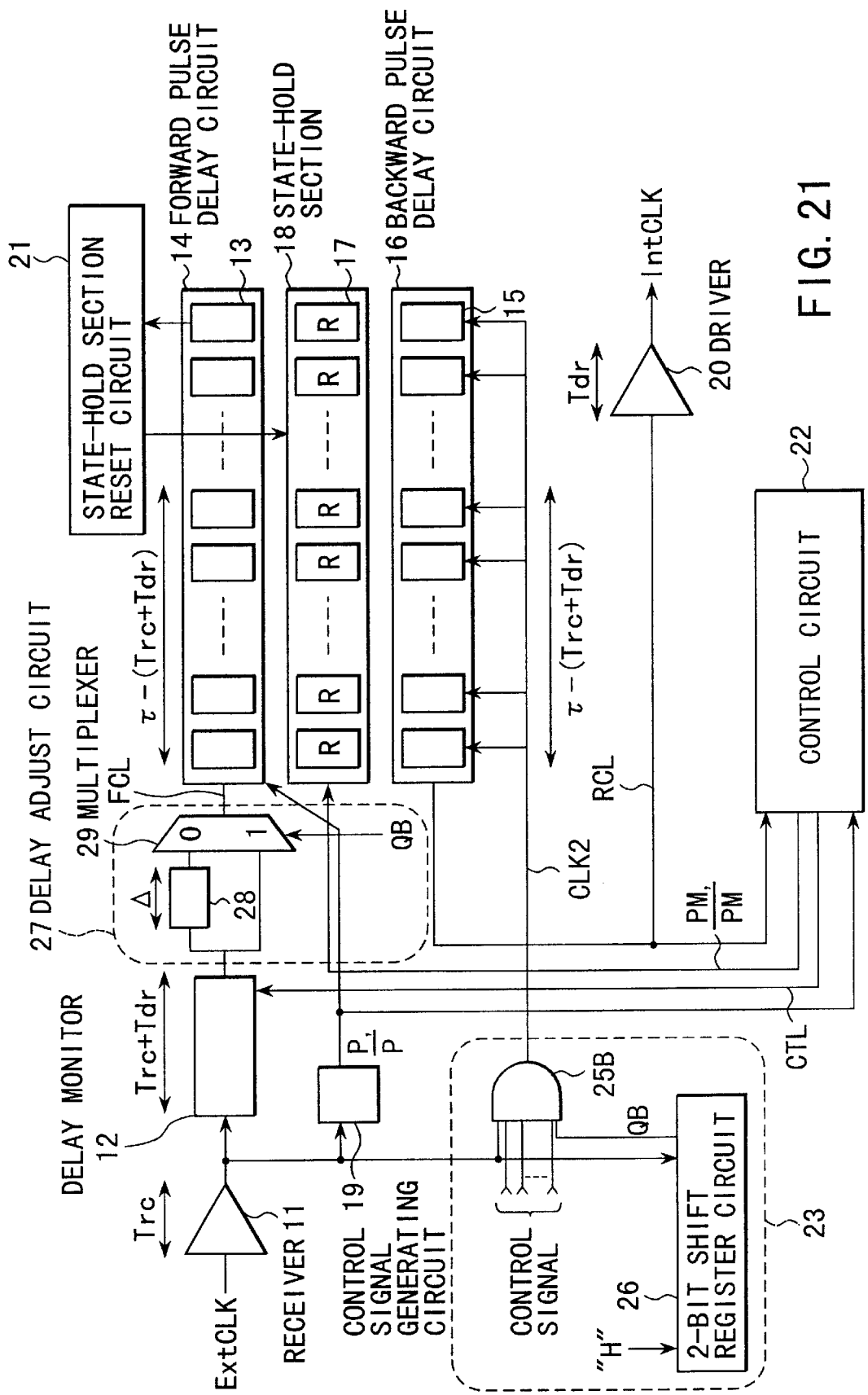
FIG. 21 is a block diagram showing a configuration of the clock control circuit according to a fourth embodiment of the invention.

FIG. 21 shows a configuration of the clock control circuit according to a fourth embodiment of the invention. The clock control circuit according to this embodiment is different from the clock control circuit according to the second embodiment shown in FIG. 16 only in that the two-input AND circuit 25 in the input stop circuit 23 is replaced by a multi-input AND circuit 25B supplied with two or more input signals.

As the result of providing the multi-input AND circuit 25B and inputting an external control signal in addition to the output signal QA from the shift register circuit 24 to the AND circuit 25B, the period during which the pulse signal CLK2 is output from the input stop circuit 23 is determined based on the control signal. Thus, a more versatile control operation is made possible.

Each of the embodiments was described with reference to the case in which a shift register for shifting one bit or two bits is used as the shift register circuit included in the input stop circuit 23. Instead, by using a shift register for shifting 3 or more bits, the time for cutting off the pulse signal CLK can of course be freely set.

Also, the provision of the input stop circuit 23 causes a delay error corresponding to the signal delay time in the input stop circuit 23 between the output pulse signal CLK of the receiver 11 and the output pulse signal CLK2 of the input stop circuit 23.

This delay error can be canceled easily by inserting a delay circuit having the same delay time as the signal delay time of the input stop circuit 23, between the delay monitor circuit 12 and the forward pulse delay circuit 14, between the control signal generating circuit 19 and the forward pulse delay circuit 14 and between the control signal generating circuit 19 and the control circuit 22.

Figure 22:
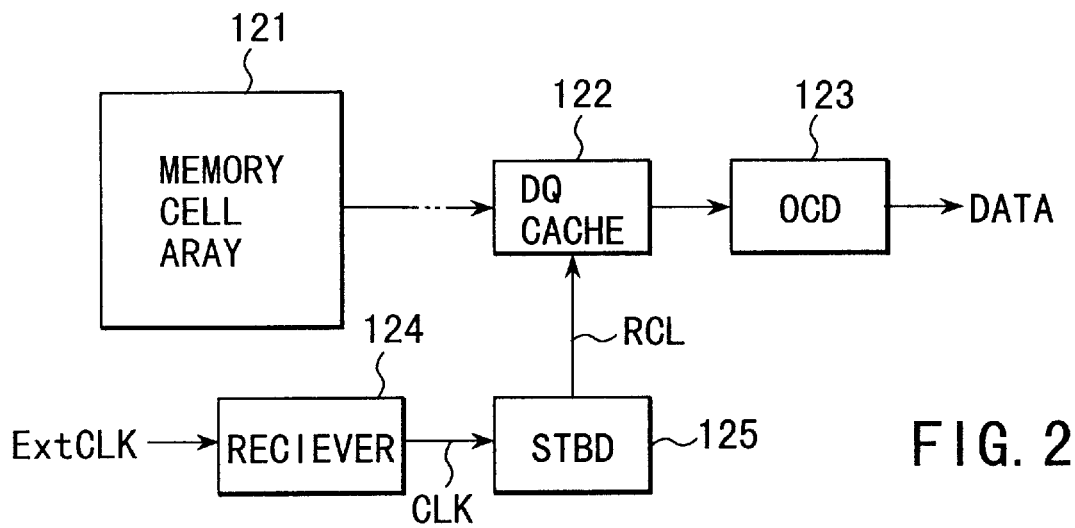
FIG. 22 is a block diagram showing a memory device according to a fifth embodiment of the invention.

FIG. 22 is a block diagram showing a memory device according to a fifth embodiment of the invention used as the clock control circuit included in each of the embodiments described above.

A memory cell array 121 includes a plurality of memory cells. These memory cells each stores data, respectively. The data stored in the plurality of the memory cells in the memory cell array 121 are read by a control circuit not shown, and supplied to the DQ cache 122. After being synchronized with the sync signal in the DQ cache 122, the data is supplied to an off-chip driver (OCD) 123 and then output out of the chip as data DATA from the OCD 123.

The receiver 124 corresponds to the clock receiver 11 in the clock control circuit shown in FIGS. 9, 16, 20 and 21, and upon receipt of the external clock signal ExtCLK, outputs the clock signal CLK. A synchronous traced backward delay (STBD) 125 corresponds to the clock control circuit shown in FIGS. 9, 16, 20 and 21, less the clock receiver 11. In this STBD 125, the pulse signal input to the driver 20, i.e. the backward pulse signal RCL is supplied to the DQ cache 122 as the sync signal.

The delay time from the time when the backward pulse signal RCL is supplied to the DQ cache 122 to the time when the data DATA is output from the OCD 123 is set substantially equal to the delay time in the driver 20. Then, the sum of the delay time in the clock receiver 11 and the delay time in the route from the DQ cache 122 to the OCD 123 is substantially equal to the delay time in the delay monitor circuit 12. As a result, the timing at which the data DATA is output from the OCD 123 is synchronized with the external clock signal ExtCLK.

Figure 23:
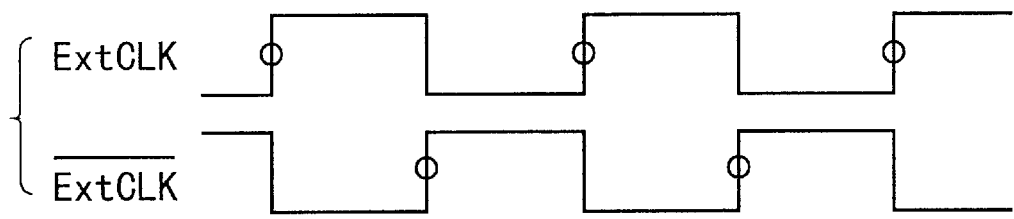
FIG. 23 is a timing chart of an external clock signal supplied to a DDR-type memory device.

As explained earlier, in the synchronous DRAM of double data rate (DDR) type which outputs a read data in synchronism with the leading and trailing edges of the external clock signal, as shown in FIG. 23, the data are read and written at the timing of both the rise of the external clock signals ExtCLK and /ExtCLK complementary with each other.

Figure 24:
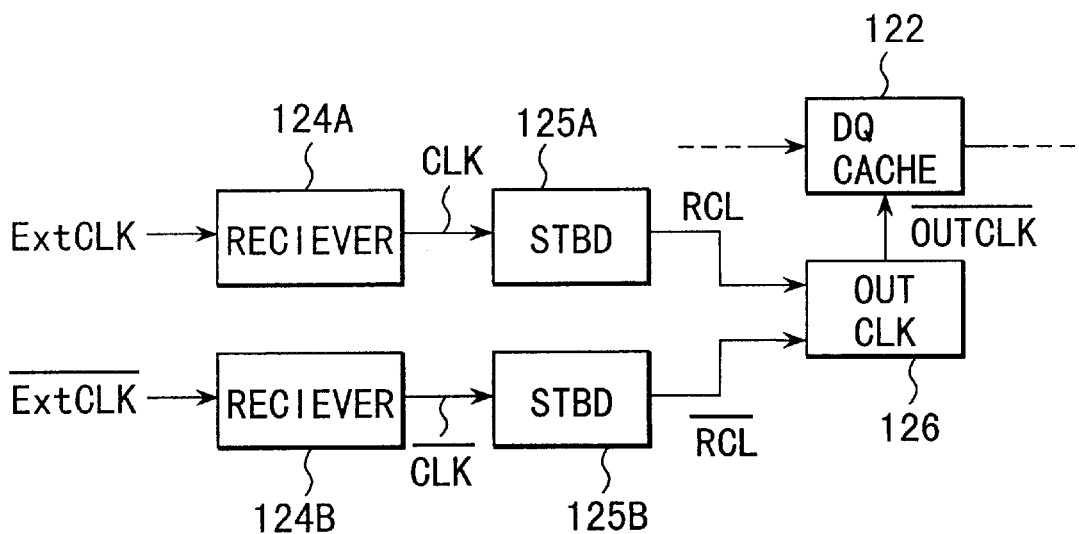
FIG. 24 is a block diagram showing a configuration of the clock control circuit according to a sixth embodiment of the invention.

FIG. 24 is a block diagram showing a clock control circuit according to a sixth embodiment of the invention. This embodiment concerns the case in which a clock control circuit is built in the synchronous DRAM of DDR type, in which the receivers 124A, 124B correspond to the receiver 124 in FIG. 22, which output the clock signals CLK, /CLK, respectively, upon receipt of the external clock signals ExtCLK, /ExtCLK. The STBDs 125A, 125B correspond to STBD 125 in FIG. 22. The backward pulse signals RCL, /RCL of levels complementary with each other are output from the STBDs 125A, 125B. The backward pulse signals RCL, /RCL are synthesized by a synthesis circuit (OUTCLK) 126 including an OR circuit, for example, and then supplied to a DQ cache similar to the DQ cache 122 in FIG. 22.

It will thus be understood from the foregoing description that according to this invention, there is provided a clock control circuit in which the internal clock signal in phase with the external clock signal can be output from the third clock, and the internal clock signal, after being started to be output, can be synchronized highly accurately with the external clock signal in any cycles.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock control circuit comprising:
   a clock receiver for receiving an external clock pulse;
   a first delay circuit for receiving the output of the clock receiver and outputting by delaying the output of the clock receiver by a first predetermined period;
   a forward pulse delay circuit including a plurality of second delay circuits connected in a multiplicity of stages for delaying the output of the first delay circuit by the first predetermined period through the plurality of the second delay circuits and sequentially transmitting the outputs of the second delay circuit as a forward pulse to the second delay circuit in the succeeding stage;
   a backward pulse delay circuit including a plurality of third delay circuits connected in a multiplicity of stages for delaying a backward pulse by the first predetermined period through the plurality of the third delay circuits, transmitting the backward pulse to the third delay circuit in the preceding stage sequentially and outputting the backward pulse from the third delay circuit in the foremost stage;
   a driver for outputting an internal clock pulse in response to the output from the backward pulse delay circuit;
   a state-hold section including a plurality of state-hold circuits in the number corresponding to the second delay circuits and the third delay circuits, wherein the output of the second delay circuit is turned from the state not supplied to the forward pulse delay circuit to the state in which the output is input to the forward pulse delay circuit so that the state-hold circuit corresponding to the second delay circuit to which the forward pulse is transmitted is set and so that the state-hold circuit corresponding to the third delay circuit to which the backward pulse is transmitted is reset, and the output of the clock receiver is input as the backward pules to the third delay circuit corresponding to the state-hold circuit which is reset after the output of the second delay circuit is input to the forward pulse delay circuit and before the backward pulse is transmitted to the backward pulse delay circuit;
   an input stop circuit for stopping inputting the output from the clock receiver into the backward pulse delay circuit during a second predetermined period from the time when the external clock pulse begins to be supplied;
   a state-hold section reset circuit for resetting all the state-hold circuits in the state-hold section before starting to supply the external clock pulse; and
   a control circuit for monitoring the backward pulse output from the backward pulse delay circuit and, according to the monitor result, resetting several state-hold circuits set after the forward pulse is transmitted to the forward pulse delay circuit.

2. The circuit according to claim 1, wherein the input stop circuit stops inputting the output of the clock receiver to the backward pulse delay circuit during the period from the time point when the supply of the external clock pulse is started to the time point when the clock receiver completely receives the first clock pulse of the external clock pulse signal.

3. The circuit according to claim 1, wherein the input stop circuit further receives a control signal, and stops inputting the output of the clock receiver to the backward pulse delay circuit during the period determined based on the control signal from the time point when the supply of the external clock pulse is started.

4. The circuit according to claim 1, wherein the input stop circuit includes a 1-bit shift circuit for shifting an H-level signal based on the output of the clock receiver, and an AND circuit for receiving at least the output of the clock receiver and the output of the 1-bit shift circuit.

5. The circuit according to claim 3, wherein the input stop circuit includes a 1-bit shift circuit for shifting an H-level signal based on the output of the clock receiver, and an AND circuit for receiving at least the output of the clock receiver and the output of the 1-bit shift circuit.

6. The circuit according to claim 1, wherein the delay time in the first delay circuit is adjusted in accordance with the output of the control circuit.

7. A clock control circuit comprising:

a clock receiver for receiving an external clock pulse;

a first delay circuit for receiving the output of the clock receiver and outputting by delaying the output of the clock receiver by a first predetermined period;

a second delay circuit for receiving the output of the first delay circuit and a first control signal, according to the first control signal, for adding a delay of the first predetermined period to the output of the first delay circuit and outputting the resulting signal;

a forward pulse delay circuit including a plurality of third delay circuits connected in a multiplicity of stages for delaying the output of the second delay circuit by the first predetermined arbitrary period through the plurality of the third delay circuits and sequentially transmitting the output of the third delay circuit as a forward pulse to the third delay circuit in the succeeding stage;

a backward pulse delay circuit including a plurality of fourth delay circuits connected in a multiplicity of stages for delaying a backward pulse by the first predetermined period through the plurality of the fourth delay circuits, transmitting the backward pulses to the fourth delay circuit in the preceding stage sequentially and outputting the backward pulses from the fourth delay circuit in the foremost stage;

a driver for outputting an internal clock pulse in response to the output from the backward pulse delay circuit;

a state-hold section including a plurality of state-hold circuits in the number corresponding to the third delay circuits and the fourth delay circuits, wherein the output of the third delay circuit is turned from the state not supplied to the forward pulse delay circuit to the state in which the output is input to the forward pulse delay circuit so that the state-hold circuit corresponding to the third delay circuit to which the forward pulse is transmitted is set and so that the state-hold circuit corresponding to the fourth delay circuit to which the backward pulse is transmitted is reset, and the output of the clock receiver is input as the backward pules to the fourth delay circuit corresponding to the state-hold circuit which is reset after the output of the third delay circuit is input to the forward pulse delay circuit and before the backward pulse is transmitted to the backward pulse delay circuit;

an input stop circuit for stopping inputting the output from the clock receiver into the backward pulse delay circuit during a second predetermined period from the time when the external clock pulse begins to be supplied;

a state-hold section reset circuit for resetting all the state-hold circuits in the state-hold section before starting to supply the external clock pulse; and a control circuit for monitoring the backward pulse output from the backward pulse delay circuit and, according to the monitor result, resetting several state-hold circuits set after the forward pulse is transmitted to the forward pulse delay circuit.

8. The circuit according to claim 7, wherein the input stop circuit stops inputting the output of the clock receiver to the backward pulse delay circuit during the period from the time point when the supply of the external clock pulse is started to the time point when the clock receiver completely receives the first clock pulse of the external clock pulse signal and starts to output the second clock pulse following the first clock pulse.

9. The circuit according to claim 7, wherein the input stop circuit further receives a second control signal, and stops inputting the output of the clock receiver to the backward pulse delay circuit during the period determined based on the second control signal from the time point when the supply of the external clock pulse is started.

10. The circuit according to claim 8, wherein the input stop circuit includes a 2-bit shift circuit for shifting an H-level signal based on the output of the clock receiver, and an AND circuit for receiving at least the output of the clock receiver and the output of the 2-bit shift circuit.

11. The circuit according to claim 9, wherein the input stop circuit includes a 2-bit shift circuit for shifting an H-level signal based on the output of the clock receiver, and an AND circuit for receiving the output of the clock receiver, the output of the 2-bit shift circuit and the second control signal.

12. The circuit according to claim 7, wherein the second delay circuit includes:

a fifth delay circuit for outputting by delaying the output of the first delay circuit by a first predetermined time; and a selector supplied with the output of the first delay circuit and the output of the fifth delay circuit for selecting one of the output of the first delay circuit and the output of the fifth delay circuit in accordance with a third control signal and outputting the selected signal to the forward pulse delay circuit.

13. The circuit according to claim 12, wherein the third control signal for controlling the select operation of the selector is the first control signal.

14. The circuit according to claim 7, wherein the delay time in the first delay circuit is adjusted in accordance with the output of the control circuit.

15. A semiconductor memory device comprising:

a memory cell array for storing data and reading the stored data therefrom;

a clock receiver for receiving an external clock pulse;

a clock control circuit; and a data output circuit for receiving the data read from the memory cell array and a pulse output from a backward pulse delay circuit and outputting the data in synchronism with a pulse output from the backward pulse delay circuit;

wherein the clock control circuit includes:

a first delay circuit for receiving the output of the clock receiver and outputting by delaying the output of the clock receiver by a first predetermined period;

a forward pulse delay circuit including a plurality of second delay circuits connected in a multiplicity of stages for delaying the output of the first delay circuit by the first predetermined period through the plurality of the second delay circuits and sequentially transmitting the outputs of the second delay circuit as a forward pulse to the second delay circuit in the succeeding stage;

the backward pulse delay circuit including a plurality of third delay circuits connected in a multiplicity of stages for delaying a backward pulse by the first predetermined period through the plurality of the third delay circuits, transmitting the backward pulse to the third delay circuit in the preceding stage sequentially and outputting the backward pulse from the third delay circuit in the foremost stage;

a state-hold section including a plurality of state-hold circuits in the number corresponding to the second delay circuits and the third delay circuits, wherein the output of the second delay circuit is turned from the state not supplied to the forward pulse delay circuit to the state in which the output is input to the forward pulse delay circuit so that the state-hold circuit corresponding to the second delay circuit to which the forward pulse is transmitted is set and so that the state-hold circuit corresponding to the third delay circuit to which the backward pulse is transmitted is reset, and the output of the clock receiver is input as the backward pules to the third delay circuit corresponding to the state-hold circuit which is reset after the output of the second delay circuit is input to the forward pulse delay circuit and before the backward pulse is transmitted to the backward pulse delay circuit;

an input stop circuit for stopping inputting the output from the clock receiver into the backward pulse delay circuit during a second predetermined period from the time when the external clock pulse begins to be supplied;

a state-hold section reset circuit for resetting all the state-hold circuits in the state-hold section before starting to supply the external clock pulse; and a control circuit for monitoring the backward pulse output from the backward pulse delay circuit and, according to the monitor result, resetting several state-hold circuits set after the forward pulse is transmitted to the forward pulse delay circuit.

16. The device according to claim 15, wherein the data output circuit includes:

a data cache for outputting the data read from the memory cell array in synchronism with the pulse output from the backward pulse delay circuit; and an off-chip driver for receiving the output of the data cache and outputting the data externally.

17. The device according to claim 16, wherein the delay time from the time point when the pulse output from the backward pulse delay circuit is input to the data output circuit to the time point when the data is output from the off-chip driver, plus the delay time in the clock receiver, is substantially equal to the delay time in the first delay circuit.

18. The device according to claim 15, wherein the input stop circuit stops inputting the output of the clock receiver to the backward pulse delay circuit during the period from the time point when the supply of the external clock pulse is started to the time point when the first clock pulse of the external clock pulse signal is completely received by the clock receiver.

19. The device according to claim 15, wherein the input stop circuit further receives a control signal, and stops inputting the output of the clock receiver to the backward pulse delay circuit during the period determined based on the control signal from the time point when the external clock pulse begins to be supplied.

20. The device according to claim 15, wherein the input stop circuit includes a 1-bit shift circuit for shifting an H-level signal based on the output of the clock receiver, and an AND circuit for receiving at least the output of the clock receiver and the output of the 1-bit shift circuit.

21. The device according to claim 19, wherein the input stop circuit includes a 1-bit shift circuit for shifting an H-level signal based on the output of the clock receiver, and an AND circuit for receiving at least the output of the clock receiver, the output of the 1-bit shift circuit and the control signal.

22. The device according to claim 15, wherein the delay time in the first delay circuit is adjusted in accordance with the output of the control circuit.

23. A clock control circuit comprising:

a first clock output circuit for receiving a first external clock pulse and outputting a first internal clock pulse; and a second clock output circuit for receiving a second external clock pulse and outputting a second internal clock pulse;

wherein each of the first clock output circuit and the second clock output circuit includes;

a clock receiver for receiving one of the first and the second external clock pulses;

a first delay circuit for receiving the output of the clock receiver and outputting by delaying the output of the clock receiver by a first predetermined period;

a forward pulse delay circuit including a plurality of second delay circuits connected in a multiplicity of stages for delaying the output of the first delay circuit by the first predetermined period through the plurality of the second delay circuits and sequentially transmitting the outputs of the second delay circuit as a forward pulse to the second delay circuit in the succeeding stage;

a backward pulse delay circuit including a plurality of third delay circuits connected in a multiplicity of stages for delaying a backward pulse by the first predetermined period through the plurality of the third delay circuits, transmitting the backward pulse to the third delay circuit in the preceding stage sequentially and outputting the backward pulse from the second delay circuit in the foremost stage;

a driver for outputting one of the first and the second internal clock pulses in response to the output from the backward pulse delay circuit;

a state-hold section including a plurality of state-hold circuits in the number corresponding to the second delay circuits and the third delay circuits, wherein the output of the second delay circuit is turned from the state not supplied to the forward pulse delay circuit to the state in which the output is input to the forward pulse delay circuit so that the state-hold circuit corresponding to the second delay circuit to which the forward pulse is transmitted is set and so that the state-hold circuit corresponding to the third delay circuit to which the backward pulse is transmitted is reset, and the output of the clock receiver is input as the backward pules to the third delay circuit corresponding to the state-hold circuit which is reset after the output of the second delay circuit is input to the forward pulse delay circuit and before the backward pulse is transmitted to the backward pulse delay circuit;

an input stop circuit for stopping inputting the output from the clock receiver to the backward pulse delay circuit during a second predetermined period from the time when one of the first and second external clock pulses begins to be supplied;

a state-hold section reset circuit for resetting all the state-hold circuits in the state-hold section before starting to supply one of the first and second external clock pulses; and a control circuit for monitoring the backward pulse output from the backward pulse delay circuit and, according to the monitor result, resetting several state-hold circuits set after the forward pulse is transmitted to the forward pulse delay circuit.

24. The circuit according to claim 23, wherein the input stop circuit stops inputting the output of the clock receiver to the backward pulse delay circuit during the period from the time point when the supply one of the first and second external clock pulses is started to the time point when the first clock pulse of one of the first and second external clock pulses signal is completely received by the clock receiver.

25. The circuit according to claim 23, wherein the input stop circuit further receives a control signal, and stops inputting the output of the clock receiver to the backward pulse delay circuit during the period determined based on the control signal from the time point when one of the first and second external clock pulses begins to be supplied.

26. The circuit according to claim 23, wherein the input stop circuit includes a 1-bit shift circuit for shifting an H-level signal based on the output of the clock receiver and an AND circuit for receiving at least the output of the clock receiver and the output of the 1-bit shift circuit.

27. The circuit according to claim 23, wherein the input stop circuit includes a 1-bit shift circuit for shifting an H-level signal based on the output of the clock receiver and an AND circuit for receiving at least the output of the clock receiver, the output of the 1-bit shift circuit and the control signal.

28. The circuit according to claim 23, wherein the delay time in the first delay circuit is adjusted in accordance with the output of the control circuit.

* * * * *